United States Patent
Jordan et al.

(10) Patent No.: US 11,432,591 B2
(45) Date of Patent: Sep. 6, 2022

(54) ELECTRONIC VAPING DEVICE HAVING PRESSURE SENSOR

(71) Applicant: Altria Client Services LLC, Richmond, VA (US)

(72) Inventors: Geoffrey Brandon Jordan, Midlothian, VA (US); Phillip Diana, Richmond, VA (US); Sean Sundberg, Richmond, VA (US); David Bennett, Richmond, VA (US); Christopher S. Tucker, Midlothian, VA (US); Barry S. Smith, Hopewell, VA (US); Edmond J. Cadieux, Mechanicsville, VA (US); Douglas A. Burton, Glen Allen, VA (US); Paul Butler, Methuen, MA (US); Jarrett Keen, Richmond, VA (US); Patrick Cobler, Andover, MA (US); Kai Cao, Somerville, MA (US)

(73) Assignee: ALTRIA CLIENT SERVICES LLC, Richmond, VA (US)

( * ) Notice: Subject to any disclaimer, the term of this patent is extended or adjusted under 35 U.S.C. 154(b) by 6 days.

(21) Appl. No.: 16/881,270

(22) Filed: May 22, 2020

(65) Prior Publication Data

US 2020/0281275 A1    Sep. 10, 2020

Related U.S. Application Data

(63) Continuation of application No. 15/191,778, filed on Jun. 24, 2016, now Pat. No. 10,736,356.

(Continued)

(51) Int. Cl.
*A24F 40/53* (2020.01)
*A24F 40/50* (2020.01)
(Continued)

(52) U.S. Cl.
CPC .............. *A24F 40/53* (2020.01); *A24F 40/50* (2020.01); *A24F 40/51* (2020.01); *A24F 40/90* (2020.01);
(Continued)

(58) Field of Classification Search
CPC .......... A24F 40/90; A24F 40/51; A24F 40/50; A24F 40/10; G01N 7/00; G05B 15/02; H02J 7/0042; H02J 7/00045; H05B 1/0244
See application file for complete search history.

(56) References Cited

U.S. PATENT DOCUMENTS

| | | |
|---|---|---|
| 5,648,711 A | 7/1997 | Hakkarainen |
| 5,963,140 A | 10/1999 | Kawaguchi et al. |

(Continued)

FOREIGN PATENT DOCUMENTS

| | | |
|---|---|---|
| CN | 202760174 U | 3/2013 |
| CN | 202890465 U | 4/2013 |

(Continued)

OTHER PUBLICATIONS

"Batteries-My Battery Isn't Working," http://help.180smoke.com/hc/en-us/articles/203292296-Batteries-My-Battery-Isn-t-Working, May 17, 2015.

(Continued)

*Primary Examiner* — Toan M Le
*Assistant Examiner* — Xiuqin Sun
(74) *Attorney, Agent, or Firm* — Harness, Dickey & Pierce, P.L.C.

(57) ABSTRACT

At least one example embodiment discloses a section of an electronic-vaping device including a pressure sensor configured to measure a current ambient pressure, the pressure sensor further configured to output the current ambient pressure measurement in accordance with a read request (Continued)

frequency, and a controller configured to determine a mode of operation of the electronic-vaping device, control the read request frequency based on the determined mode of operation, and detect a threshold pressure change based on the current ambient pressure and a baseline pressure.

19 Claims, 20 Drawing Sheets

Related U.S. Application Data

(60) Provisional application No. 62/184,632, filed on Jun. 25, 2015, provisional application No. 62/184,569, filed on Jun. 25, 2015, provisional application No. 62/184,778, filed on Jun. 25, 2015, provisional application No. 62/184,647, filed on Jun. 25, 2015.

(51) Int. Cl.
| | |
|---|---|
| *A24F 40/51* | (2020.01) |
| *A24F 40/90* | (2020.01) |
| *G01N 7/00* | (2006.01) |
| *G05B 15/02* | (2006.01) |
| *H02J 7/00* | (2006.01) |
| *H05B 1/02* | (2006.01) |
| *A24F 40/10* | (2020.01) |

(52) U.S. Cl.
CPC .............. *G01N 7/00* (2013.01); *G05B 15/02* (2013.01); *H02J 7/0042* (2013.01); *H05B 1/0244* (2013.01); *A24F 40/10* (2020.01); *H02J 7/00045* (2020.01)

(56) References Cited

U.S. PATENT DOCUMENTS

| | | | |
|---|---|---|---|
| 6,810,883 B2 | 11/2004 | Felter et al. | |
| 7,002,265 B2 | 2/2006 | Potega | |
| 7,430,918 B2 | 10/2008 | Selvan et al. | |
| 8,205,622 B2 | 6/2012 | Pan | |
| 8,365,742 B2 | 2/2013 | Hon | |
| 8,511,318 B2 | 8/2013 | Hon | |
| 8,627,726 B2 | 1/2014 | Phan Le et al. | |
| 8,820,330 B2 | 9/2014 | Bellinger et al. | |
| 8,851,081 B2 | 10/2014 | Fernando et al. | |
| 8,863,753 B2 | 10/2014 | Li et al. | |
| 8,897,628 B2 | 11/2014 | Conley et al. | |
| 9,497,999 B2 * | 11/2016 | Lord | A24F 40/53 |
| 9,955,724 B2 | 5/2018 | Lord | |
| 2006/0196518 A1 | 9/2006 | Hon | |
| 2007/0028683 A1 | 2/2007 | Ionescu-Zanetti | |
| 2009/0178672 A1 | 7/2009 | Mullinger et al. | |
| 2011/0277764 A1 | 11/2011 | Terry et al. | |
| 2012/0186594 A1 | 7/2012 | Liu | |
| 2012/0199146 A1 | 8/2012 | Marangos | |
| 2013/0042865 A1 * | 2/2013 | Monsees | A24F 40/90 |
| | | | 128/203.27 |
| 2013/0174842 A1 | 7/2013 | Young et al. | |
| 2013/0284192 A1 | 10/2013 | Peleg et al. | |
| 2013/0298905 A1 | 11/2013 | Levin et al. | |
| 2014/0001412 A1 | 1/2014 | Munnangi et al. | |
| 2014/0014125 A1 | 1/2014 | Fernando et al. | |
| 2014/0014126 A1 | 1/2014 | Peleg et al. | |
| 2014/0041658 A1 | 2/2014 | Goodman et al. | |
| 2014/0053858 A1 | 2/2014 | Liu | |
| 2014/0096782 A1 | 4/2014 | Ampolini et al. | |
| 2014/0150810 A1 | 6/2014 | Hon | |
| 2014/0251324 A1 | 9/2014 | Xiang | |
| 2014/0261408 A1 | 9/2014 | DePiano et al. | |
| 2014/0278258 A1 | 9/2014 | Shafer | |
| 2014/0283856 A1 | 9/2014 | Xiang | |
| 2014/0345633 A1 | 11/2014 | Talon et al. | |
| 2015/0053217 A1 | 2/2015 | Steingraber et al. | |
| 2015/0059779 A1 | 3/2015 | Alarcon et al. | |
| 2015/0101625 A1 | 4/2015 | Newton et al. | |
| 2015/0102777 A1 | 4/2015 | Cooper | |
| 2015/0114408 A1 | 4/2015 | Lord | |
| 2015/0128971 A1 | 5/2015 | Verleur et al. | |
| 2015/0224268 A1 * | 8/2015 | Henry | G06Q 30/00 |
| | | | 128/202.21 |
| 2015/0245654 A1 * | 9/2015 | Memari | A24F 40/90 |
| | | | 141/2 |
| 2016/0128389 A1 * | 5/2016 | Lamb | A24F 40/51 |
| | | | 131/328 |
| 2018/0043114 A1 | 2/2018 | Bowen et al. | |

FOREIGN PATENT DOCUMENTS

| | | | | |
|---|---|---|---|---|
| CN | 203262281 U | 11/2013 | | |
| CN | 103734916 A | 4/2014 | | |
| CN | 203646504 U | 6/2014 | | |
| DE | 102007011120 A1 | 9/2008 | | |
| GB | 2507104 A | 4/2014 | | |
| GB | 2519101 A * | 4/2015 | ........... | H05B 3/0014 |
| WO | WO-2014040988 A2 | 3/2014 | | |
| WO | WO-2014054035 A1 | 4/2014 | | |
| WO | WO-2015052513 A2 | 4/2015 | | |
| WO | WO-2015/063126 A1 | 5/2015 | | |

OTHER PUBLICATIONS

"Smokio Vaporizer," http://us.smokio.com/device/, May 19, 2015.
"Integrated Medicine Delivery System," http://intemed.net/intevape-sc/, May 19, 2015.
"MEMS in the Medical World," http://archives.sensormag.com/articles/0497/medical/, Oct. 18, 2006.
International Search Report dated Oct. 7, 2016.
International Search Report and Written Opinion dated Nov. 29, 2016.
International Preliminary Report on Patentability dated Dec. 26, 2017.

* cited by examiner

ELECTRONIC VAPING DEVICE HAVING PRESSURE SENSOR

PRIORITY

This non-provisional patent application is a continuation of U.S. application Ser. No. 15/191,778, filed on Jun. 24, 2016, which claims priority under 35 U.S.C. § 119(e) to provisional U.S. application Ser. Nos. 62/184,632 filed on Jun. 25, 2015, 62/184,647 filed on Jun. 25, 2015, 62/184,569 filed on Jun. 25, 2015 and 62/184,778 filed on Jun. 25, 2015, all in the United States Patent and Trademark Office, the entire contents of each of which are incorporated herein by reference.

BACKGROUND

Field

At least some example embodiments relate generally to an electronic vaping (e-vaping) device.

Related Art

Electronic vaping devices are used to vaporize a pre-vapor formulation into a vapor. These electronic vaping devices may be referred to as e-vaping devices. E-vaping devices include a heater, which vaporizes the pre-vapor formulation to produce the vapor. The e-vaping device may include several e-vaping elements including a power source, a cartridge or e-vaping tank including the heater and a reservoir capable of holding the pre-vapor formulation.

SUMMARY

At least some example embodiments relate to an e-vaping device.

At least one example embodiment discloses a section of an electronic-vaping device including a pressure sensor configured to measure a current ambient pressure, the pressure sensor further configured to output the current ambient pressure measurement in accordance with a read request frequency and a controller configured to determine a mode of operation of the electronic-vaping device, control the read request frequency based on the determined mode of operation, and detect a threshold pressure change based on the current ambient pressure and a baseline pressure.

In an example embodiment, the controller is configured to control the read request frequency such that the read request frequency has a first frequency in a first mode of operation and a second frequency in a second mode of operation, the first frequency being different than the second frequency and the first and second frequencies being greater than zero.

In an example embodiment, the first frequency is higher than the second frequency, the first mode of operation is an active mode and the second mode of operation is associated with reduced power consumption relative to the active mode.

In an example embodiment, the controller is configured to determine the baseline pressure based on previous ambient pressure measurements.

In an example embodiment, the controller is configured to determine an average of the previous ambient pressure measurements, the average of the previous ambient pressure measurements being the baseline pressure.

In an example embodiment, the previous ambient pressure measurements are received by the controller within a threshold time period.

In an example embodiment, the controller is configured to ignore previous ambient pressure measurements received within a threshold time period upon detecting the threshold pressure change.

In an example embodiment, the controller is configured to control the electronic-vaping device in a reduced power state if the pressure sensor measures a positive pressure as the current ambient pressure.

In an example embodiment, the pressure sensor is a microelectromechanical system (MEMS) sensor.

At least one example embodiment discloses an electronic-vaping device including a cartridge including a heating element and a power supply section, the power supply section and the cartridge being configured to connect, the power supply section including a pressure sensor configured to measure a current ambient pressure and further configured to output the current ambient pressure measurement in accordance with a read request frequency, and a controller configured to determine a mode of operation of the electronic-vaping device, control the read request frequency based on the determined mode of operation, and detect a threshold pressure change based on the current ambient pressure and a baseline pressure.

In an example embodiment, the controller is configured to control the read request frequency such that the read request frequency has a first frequency in a first mode of operation and a second frequency in a second mode of operation, the first frequency being different than the second frequency and the first and second frequencies being greater than zero.

In an example embodiment, the first frequency is higher than the second frequency, the first mode of operation is an active mode and the second mode of operation is associated with reduced power consumption relative to the active mode.

In an example embodiment, the controller is configured to determine the baseline pressure based on previous ambient pressure measurements.

In an example embodiment, the controller is configured to determine an average of the previous ambient pressure measurements, the average of the previous ambient pressure measurements being the baseline pressure.

In an example embodiment, the previous ambient pressure measurements are received by the controller within a threshold time period.

In an example embodiment, the controller is configured to ignore previous ambient pressure measurements received within a threshold time period upon detecting the threshold pressure change.

In an example embodiment, the controller is configured to control the electronic-vaping device in a reduced power state if the pressure sensor measures a positive pressure as the current ambient pressure.

In an example embodiment, the pressure sensor is a microelectromechanical system (MEMS) sensor.

At least one example embodiment discloses a method of detecting a threshold pressure change within an electronic vaping device. The method includes determining a mode of operation of the electronic vaping device, determining a read request frequency based on the mode of operation, receiving a current pressure measurement based on the read request frequency and determining a threshold pressure change of the electronic vaping device based on the current pressure measurement and a baseline pressure.

BRIEF DESCRIPTION OF THE DRAWINGS

The above and other features and advantages of example embodiments will become more apparent by describing, example embodiments in detail with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
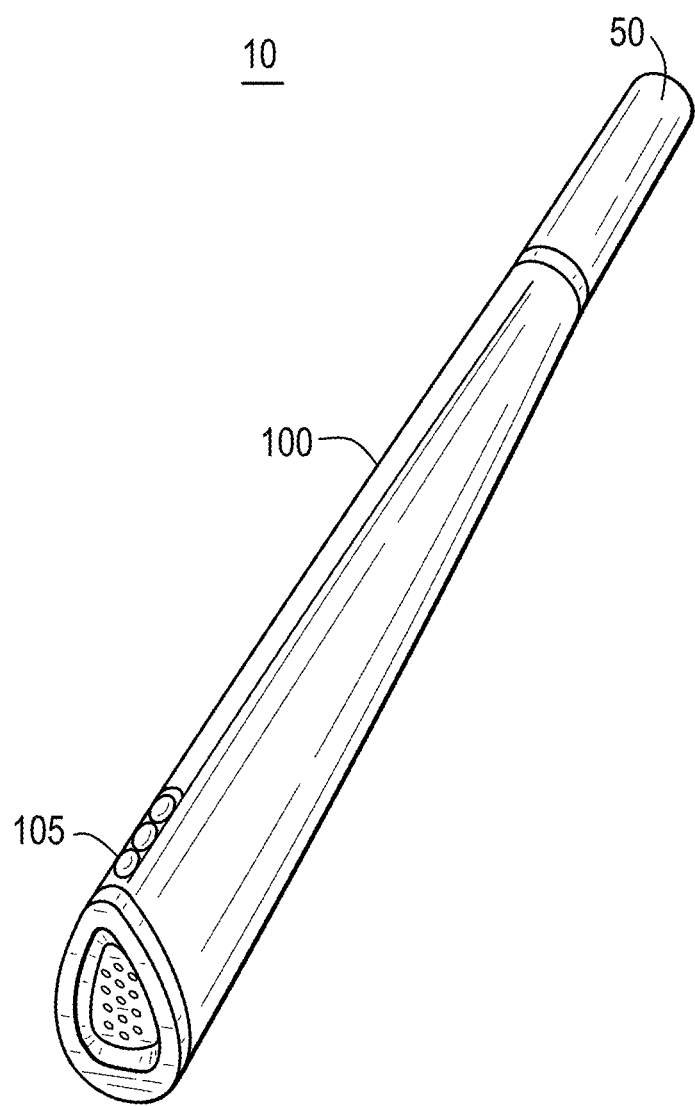
FIG. 1 illustrates an electronic vaping device including a reusable section according to an example embodiment.

Some detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, regions, layers and/or sections, these elements, regions, layers, and/or sections should not be limited by these terms. These terms are only used to distinguish one element, region, layer, or section from another region, layer, or section. Thus, a first element, region, layer, or section discussed below could be termed a second element, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising,"

when used in this specification, specify the presence of stated features, integers, steps, operations and/or elements, but do not preclude the presence or addition of one or more other features, integers, steps, operations, elements and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Referring to FIG. 1, an electronic vaping (e-vaping) device 10 includes a replaceable cartridge (or first section) 50, a reusable section (or second section) 100 and light indicators 105.

The light indicators 105 may be controlled by a controller and indicate a status of the e-vaping device 10. The light indicators 105 may be three light-emitting diodes (LEDs) that are used in various sequences to illustrate at least the following states of the e-vaping device 10: Cartridge Detected, Battery Removed From Charger, Negative Pressure Applied, Battery Level, Disabled Mode, Enabled Mode, Cartridge Error and Battery Error.

The first section 50 and the second section 100 may be coupled together at a connection using a connector. The connector may include a male connecting portion and a female connecting portion. The male connecting portion may be secured to one of the first section 50 and the second section 100. The male connecting portion may include a pair of mating arms extending from a rim of the male connecting portion. The pair of mating arms and the rim may define a pair of angled slots therebetween. A terminus of each of the pair of angled slots includes an enlarged socket end. The female connecting portion is secured to the other of the first section 50 and the second section 100. For example, when the male connecting portion is secured to the first section 50, the female connecting portion is secured to the second section 100 (and vice versa). The female connecting portion may include an inner surface and a pair of lugs on the inner surface. The female connecting portion is configured to longitudinally and rotationally receive the pair of mating arms of the male connecting portion so as to engage each of the pair of lugs of the female connecting portion within the enlarged socket end of each of the pair of angled slots of the male connecting portion to electrically couple the first section 50 and the second section 100.

The second section 100 may also include a pressure sensor to monitor a pressure within the second section 100, a power supply and a controller configured to control and interpret data from the pressure sensor.

The first section 50 may include a vaporizer assembly configured to heat a pre-vapor formulation to generate a vapor. A pre-vapor formulation is a material or combination of materials that may be transformed into a vapor. For example, the pre-vapor formulation may be a liquid, solid, and/or gel formulation including, but not limited to, water, beads, solvents, active ingredients, ethanol, plant extracts, natural or artificial flavors, and/or vapor formers such as glycerine and propylene glycol. The battery assembly is configured to power the vaporizer assembly.

Figure 2:
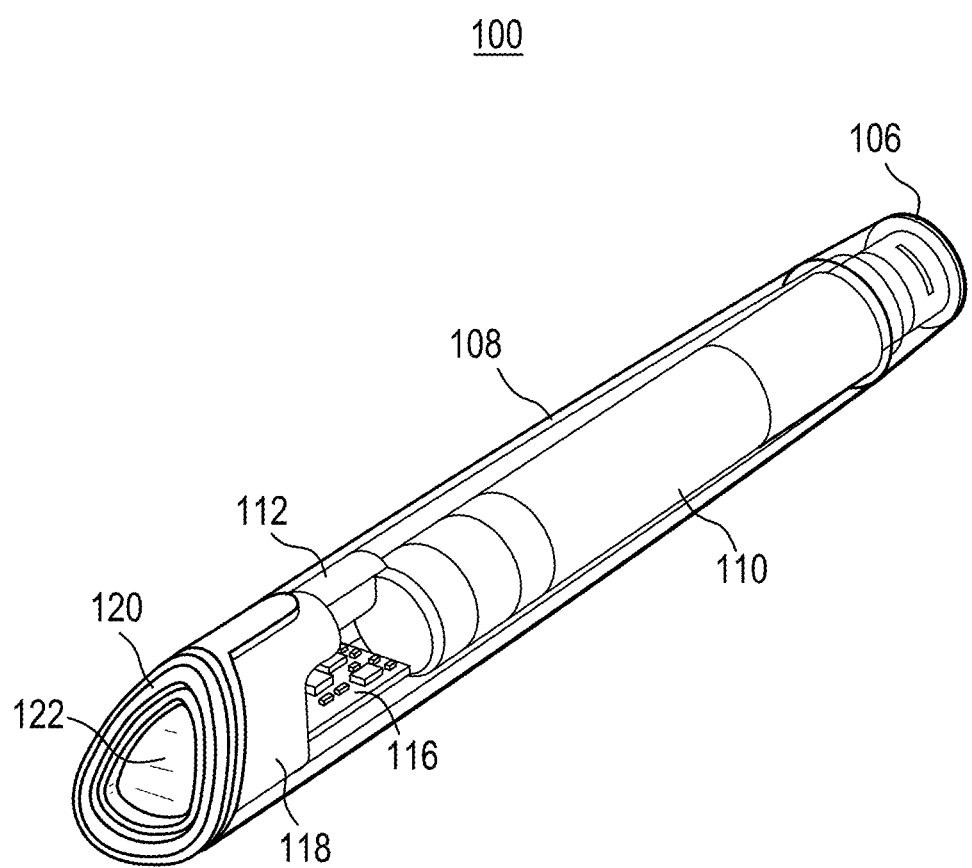
FIG. 2 illustrates a semi-transparent view of an example embodiment of the reusable section shown in FIG. 1.

FIG. 2 illustrates a semi-transparent view of the second section 100. As shown in FIG. 2, the second section 100 includes a female connecting portion 106, a housing 108, a power supply 110, a light pipe assembly 112, a printed circuit board (PCB) 116, an end cap 118, a positive contact 120 and a common contact 122. The light pipe assembly 112 includes a light article (e.g., light pipe) 114 which holds the lighting indicators.

A female connecting portion 106 is disposed at a proximal end of the housing 108, while the end cap 118, the first contact 120 (e.g., positive contact), and the second contact 122 (e.g., common contact) are disposed at an opposing, distal end of the housing 108. The second section 100 has a proximal end (adjacent to the female connecting portion 106) with a cylindrical shape that transitions into a triangular form at the opposing, distal end (adjacent to the second contact 122). For instance, the opposing, distal end may have a cross-sectional shape that resembles a Reuleaux triangle. A Reuleaux triangle is a shape formed from the intersection of three circles, each having its center on the boundary of the other two. The second section 100 may also have a slanted end face (relative to the longitudinal axis of the second section 100). However, it should be understood that example embodiments may have other configurations and are not limited to the above forms.

The female connecting portion 106 provides a connection to the first section 50. The female connecting portion 106 is made of a conductive material to provide an electrical connection between the second section 100 and the first section 50. For example, the female connecting portion 106 may have a base made of brass that is plated with nickel and then top plated with silver.

More specifically, upon completing the connection, the power supply 110 is electrically connected with a heater element of the first section 50 upon sensing negative pressure applied by an adult vaper by a pressure sensor. Air is drawn primarily into the first section 50 through one or more air inlets (see, e.g., FIG. 3B). Example embodiments are not limited to e-vaping devices using a pressure sensor to activate the vaping. Rather, example embodiments are also applicable to e-vaping devices that use another means for activation, such as a push button or a capacitive button.

The power supply 110 may be operably connected to the heater (as described below) to apply a voltage across the heater. The e-vaping device 10 also includes at least one air inlet operable to deliver air to a central air passage of the first section 50.

Furthermore, the power supply 110 supplies power to a controller on the PCB 116, as will be described in greater detail below.

The power supply 110 may be a Lithium-ion battery or one of its variants, for example a Lithium-ion polymer battery. Alternatively, the power supply 110 may be a Nickel-metal hydride battery, a Nickel cadmium battery, a Lithium-manganese battery, a Lithium-cobalt battery or a fuel cell. In that case, the e-vaping device 10 is usable until the energy in the power supply 110 is depleted or below a set threshold. The power supply 110 may be rechargeable and the PCB 116 includes circuitry allowing the battery to be chargeable by an external charging device.

Figure 3A:
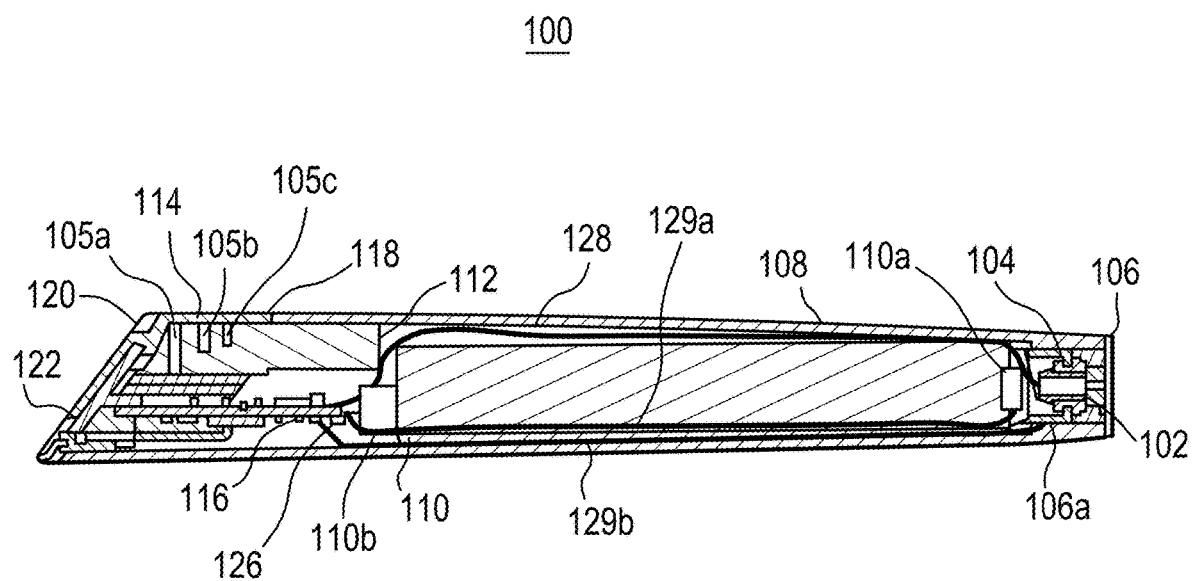
FIG. 3A illustrates a cross-sectional view of an example embodiment of the reusable section shown in FIG. 1.

FIG. 3A illustrates a cross-sectional view of the second section 100. Referring to FIG. 3A, the second section 100 may increase in size from the proximal end (adjacent to the female connecting portion 106) to the opposing, distal end (adjacent to the second contact 122). The anode portion 102 and a female insulating member 104 may be disposed within the female connecting portion 106. The female insulating member 104 may be an annular structure, with the anode portion 102 extending therethrough. For instance, the anode portion 102 may be arranged concentrically within the female connecting portion 106 while being electrically isolated therefrom via the female insulating member 104.

As shown in FIG. 3A, the power supply 110 may include a battery arranged in the e-vaping device 10 such that a cathode 110a of the power supply 110 may be downstream of an anode 110b of the power supply 110. The cathode 110a is connected to the PCB 116 by a wire 129a. The PCB 116 is then connected to the cathode portion 106a by a wire 129b. An anode portion 102 of the female connecting portion 106 may be connected to the anode 110b through a wire 128. More specifically, the anode 110b is connected to the circuitry of the PCB 116 by a wire 126. The circuitry on the PCB 116 acts as a switch to connect the anode 110b of the power supply 110 to the anode portion 102 of the female connecting portion 106, and the cathode 110a of the power supply 110 to the cathode portion 106a. When the PCB circuitry enables the switch, current is allowed to flow though this circuitry if the anode portion 102 is connected to an acceptable circuit (e.g., the first section 50).

It should be understood that the locations of the cathode portion 106a and the anode portion 102 may be switched within the female connecting portion 106.

Figure 3B:
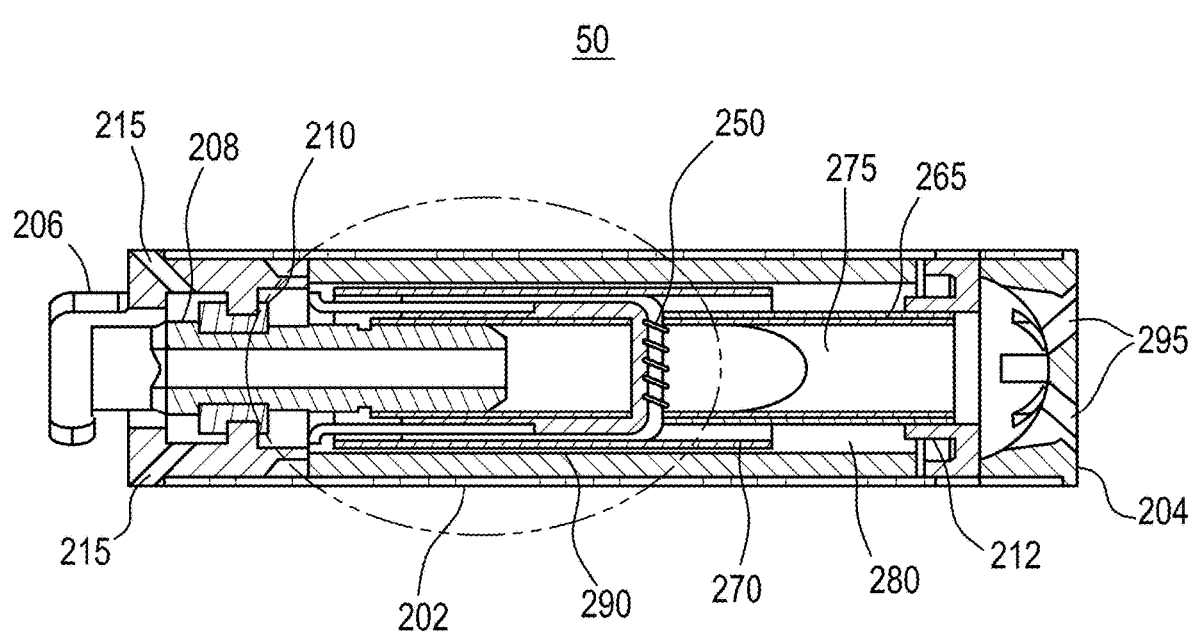
FIG. 3B illustrates a cross-sectional view of an example embodiment of the cartridge section shown in FIG. 1.

FIG. 3B illustrates a cross-sectional view of an example embodiment of the first section 50 shown in FIG. 1. Referring to FIG. 3B, the first section (or cartridge section) 50 includes a housing 202 with a proximal end and an opposing, distal end. The housing 202 may be formed of metal (e.g., stainless steel), although other suitable materials may be used. A mouthpiece 204 and a sealing ring 212 are disposed at the proximal end of the housing 202, while a male connecting portion 206 (e.g., vaporizer connector) is disposed at the opposing, distal end of the housing 202. A male anode 208 (e.g., post) and a male insulating member 210 (e.g., gasket ring) may be disposed within the male connecting portion 206. The male insulating member 210 may be an annular structure, with the male anode 208 extending therethrough. For instance, the male anode 208 may be arranged concentrically within the male connecting portion 206 while being electrically isolated therefrom via the male insulating member 210. The male insulating member 210 and the sealing ring 212 may be formed of silicone. The first section 50 may include one or more air inlets 215 through which air may be drawn and the pressure sensor may measure the air pressure resulting from the air drawn through the one or more air inlets 215.

The male connecting portion 206 of the first section 50 may, upon attachment of the first section 50 and the second section 100, electrically connect to cathode portion 106a of the second section 100. The first section 50 and the second section 100 may be attached by engaging the female connecting portion 106 of the second section 100 with the male connecting portion 206 of the first section 50. The first section 50 may include a vaporizer 250. The vaporizer 250 may include a heating element (or heater) for vaporizing the pre-vapor formulation.

From the above description of FIGS. 3A and 3B, it should be understood that the first section 50 and the second section 100 may be coupled together at a connection using a connector. The connector may include the male connecting portion 206 and the female connecting portion 106. According to example embodiments shown in FIGS. 3A and 3B, the male connecting portion 206 may be secured to the first section 50 while the female connecting portion 106 may be secured to the second section 100. The male connecting portion 206 may include a pair of mating arms extending from a rim of the male connecting portion. The pair of mating arms and the rim may define a pair of angled slots therebetween. A terminus of each of the pair of angled slots includes an enlarged socket end. The female connecting portion 106 is secured to the first section 50. For example, when the male connecting portion 206 is secured to the second section 100, the female connecting portion 106 is secured to the first section 50 (and vice versa). The female connecting portion 106 may include an inner surface and a pair of lugs on the inner surface. The female connecting portion 106 is configured to longitudinally and rotationally receive the pair of mating arms of the male connecting portion 206 so as to engage each of the pair of lugs of the female connecting portion 106 within the enlarged socket end of each of the pair of angled slots of the male connecting portion 206 to electrically couple the first section 50 and the second section 100.

Figure 3C:
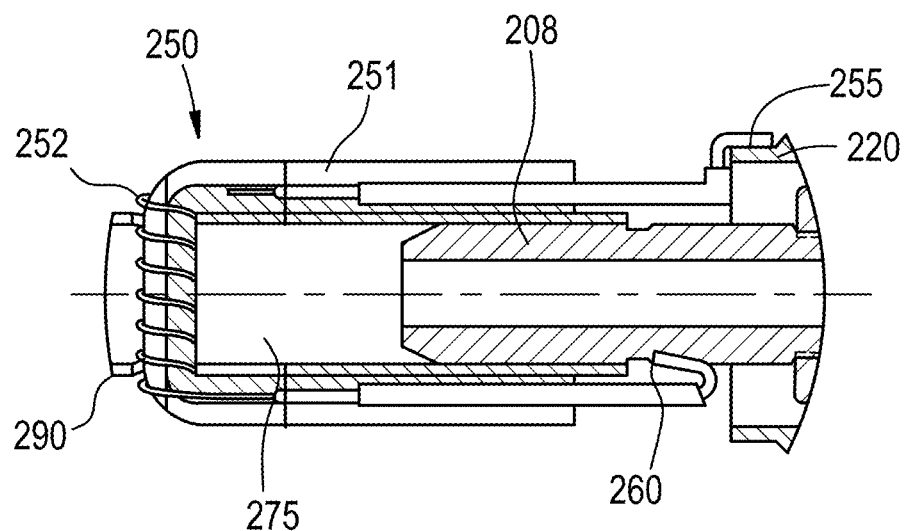
FIG. 3C illustrates a close-up cross-sectional view of an example embodiment of the cartridge section within the dashed lines of FIG. 3B.

FIG. 3C illustrates a close-up cross-sectional view of an example embodiment of the cartridge section shown in FIG. 3B within the dashed line. As shown in FIG. 3C, a heater 252 of the vaporizer 250 may be electrically connected to a body 220 of the male connecting portion 206 and the male anode 208 at connection points 255 and 260, respectively.

With reference to FIGS. 3B and 3C, the housing 202 may include a reservoir 290 with porous materials 270 and 280. The reservoir 290 and the porous materials 270 and 280 may contain the pre-vapor formulation. A density of the porous material 270 may be greater than a density of the porous material 280. The housing 202 may include the vaporizer 250. The vaporizer 250 may include a porous element 251 in fluid communication with the pre-vapor formulation contained within the reservoir 290. The vaporizer 250 may include the heating element (or heater) 252 for vaporizing the pre-vapor formulation contained in the porous element 251. A portion of the heater 252 may be coiled around the porous element 251 while two electrical leads of the heater 252 extend to connection points 255 and 260, respectively. The housing 202 may include an inner tube 265 defining central air channel 275 to allow for air flow between air outlets 295 of the mouth piece 204 and the air inlets 215. The vaporizer 250 may be arranged in the air channel 275 such that vapor generated by the vaporizer may flow toward the mouthpiece 204.

Figure 3D:
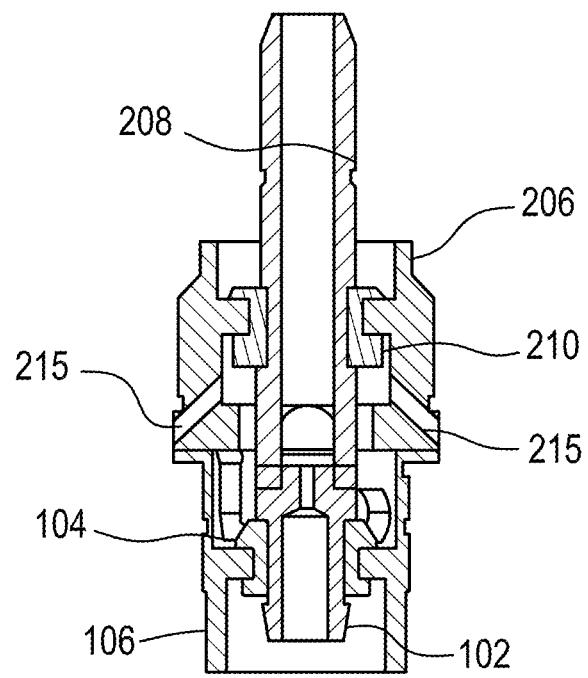
FIG. 3D illustrates a cross sectional view of a connection area between the cartridge section and the reusable section in FIG. 1.

FIG. 3D illustrates a cross sectional view of a connection area between the first section and the second section in FIG. 1. FIG. 3D shows the electrical connection between the male anode 208 and the anode portion (female anode) 102, and the electrical connection between the male connecting portion 206 and the cathode portion 106a.

With reference to FIGS. 3A-3D, electrical connection between the anode 110b of the power supply 110 and the heater 252 in the first section 50 may be established through the PCB 116, the anode portion (female anode) 102 in the second section 100, the male anode 208 in the first section 50, and a connection point 260 on the male anode 208 with a first electrical lead of the heater 252. Similarly, electrical connection between the cathode 110a of the power supply 110 and a second electrical lead of the heater 252 may be established through the PCB 116, the cathode portion 106a of the connecting portion 106, the male connecting portion 206, and the connection point 255 of the second electrical lead to the body 220 of the male connecting portion 206. The connection points 255 and 260 may be achieved by, for example, spot welding or soldering the two electrical leads of the heater 252.

Referring back to FIG. 3A, the housing 108 may be made of a plastic and plated with aluminum and coated with gunmetal pigment. The housing 108 extends in a longitudinal direction and houses the power supply 110, the light pipe assembly 112 and the PCB 116. The female connecting portion 106 and the end cap 118 are provided at opposing ends of the housing 108. The positive contact 120 and common contact 122 are attached to an exposed face of the end cap 118. Both the positive contact 120 and the common contact 122 may be coated with nickel and silver.

The light article 114 (e.g., light pipe) may be disposed in the distal end of the second section 100. The light article 114 contains light indicators 105a-105c that are configured to emit a light that is visible to an adult vaper based on the state of the e-vapor device. In an example embodiment, the light indicators 105a-105c may emit a light of a first color during vaping, a light of a second color when the power supply 110 is running low, and/or a light of a third color when the power supply 110 is being charged. In lieu of (or in addition to) colored lights, the light indicators 105a-105c may emit a flashing light and/or a pattern of lights as a status indicator.

For example, the light indicators 105a-105c may be light-emitting diodes (LEDs) that are used in various sequences to illustrate at least the following states: Cartridge Detected, Battery Removed From Charger, Negative Pressure Applied, Battery Level, Disabled Mode, Enabled Mode, Cartridge Error and Battery Error.

The positive contact 120 and the common contact 122 may be connected to the PCB 116 by wires. The positive contact 120 and the common contact 122 are connected to the PCB 116 in such a fashion as to permit a charger to communicate with the controller on the PCB 116 and supply power to the power supply 110. More specifically, when the second section 100 is inserted into a charger, two prongs of the charger, the common contact and the positive contact form a closed circuit.

Figure 4:
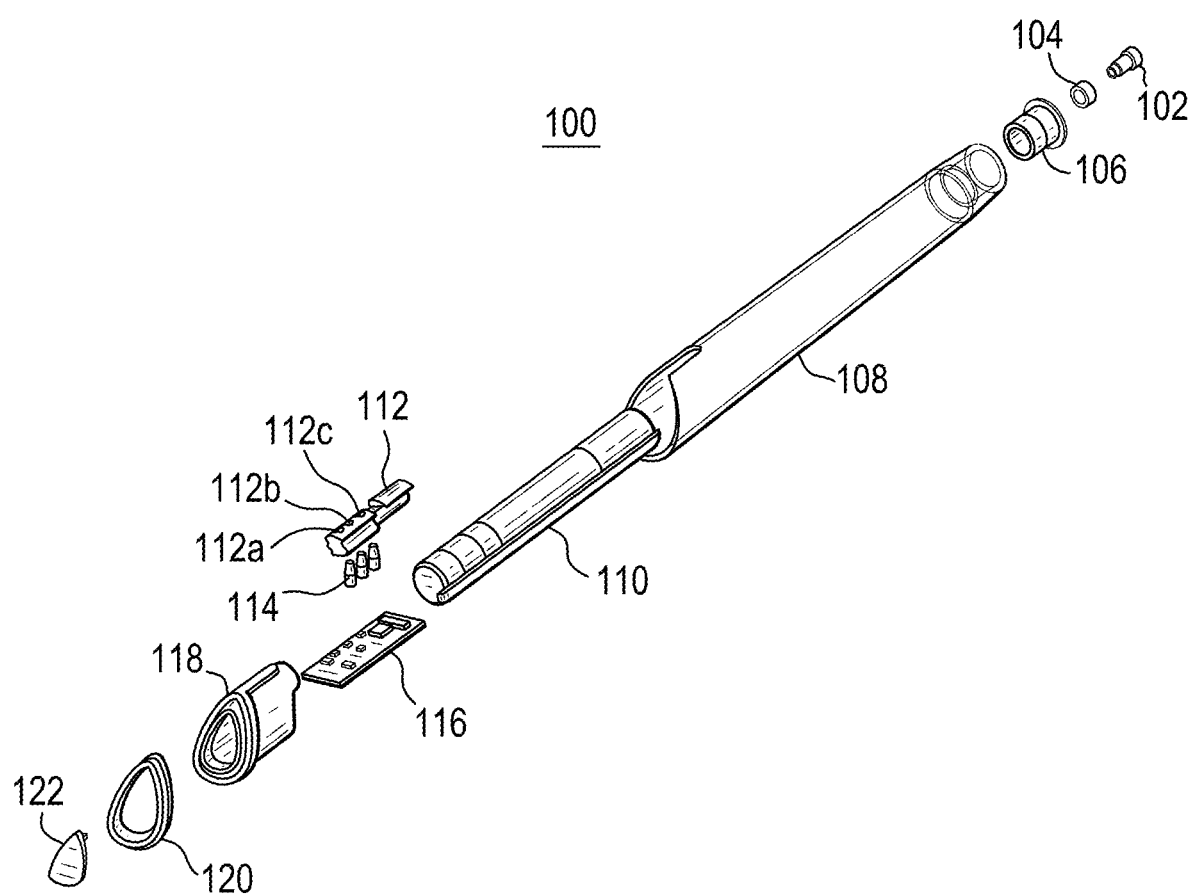
FIG. 4 illustrates an exploded view of an example embodiment of the reusable section shown in FIG. 1.

FIG. 4 illustrates an exploded view of the second section 100. As shown in FIG. 4, the light pipe 114 may be fitted to be inserted in cylindrical bores 112a, 112b and 112c of the light pipe assembly 112.

Figure 5A:
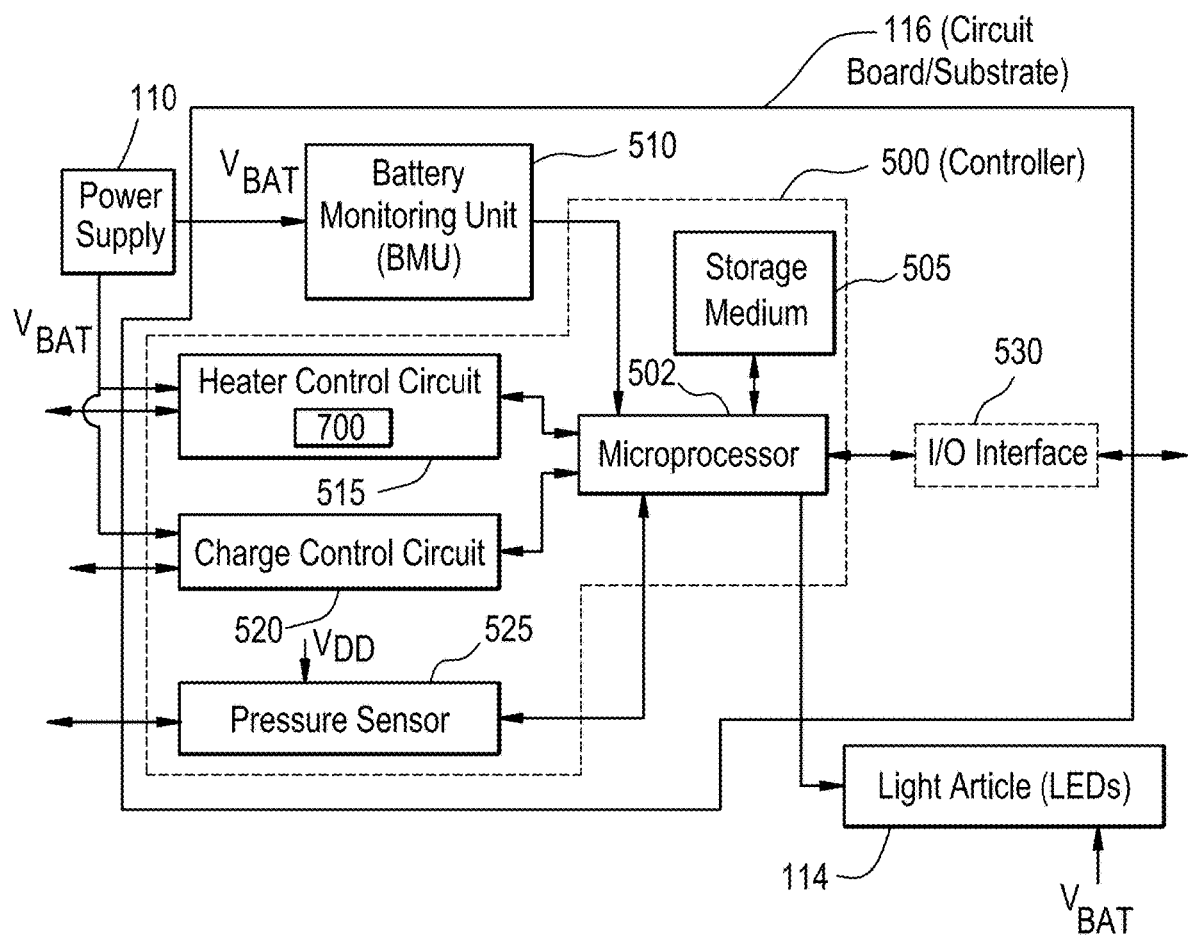
FIG. 5A illustrates an example embodiment of a circuit board of the electronic vaping device shown in FIG. 1.

FIG. 5A illustrates a block diagram of elements on the PCB 116, according to an example embodiment.

As shown, the PCB 116 may include a controller 500 and a battery monitoring unit (BMU) 510. In some example embodiments, the PCB 116 includes an external device input/output interface 530. The I/O interface 530 may be a Bluetooth interface, for example.

The controller 500 includes a microprocessor 502, a computer-readable storage medium 505, a heater control circuit 515, a charge control circuit 520 and a pressure sensor 525.

The controller 500 performs features of the second section 100, as well as the entire e-vaping device 10, such as controlling the heater, interfacing with an external charger and monitoring the pressure within the e-vaping device 10 to determine whether an adult vaper has applied a negative pressure. Moreover, the controller 500 may determine whether an adult vaper has applied a positive pressure for a threshold time. In such an instance, the controller 500 may place the e-vaping device 10 in a disabled and or hibernation mode (reduced power consumption and/or preventing activation).

The controller 500 may be hardware, firmware, hardware executing software or any combination thereof. When the controller 500 is hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the controller 500.

In the event where the controller 500 is a processor executing software, the controller 500 is configured as a special purpose machine to execute the software, stored in the computer-readable storage medium 505, to perform the functions of the controller 500.

Furthermore, as shown in the example embodiment shown in FIG. 5A, the controller 500 may be a combination of hardware and a processor executing software. As shown, hardware elements may include the computer-readable storage medium 505, the heater control circuit 515, the charge control circuit 520 and the pressure sensor 525. As shown, the microprocessor 502 is configured to control the operation of the hardware elements described above by executing software stored on the computer-readable storage medium 505.

As disclosed herein, the term "computer-readable storage medium" or "non-transitory computer-readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable storage medium" may include, but is not limited to, portable or fixed storage devices, optical storage devices, and various other mediums capable of storing, containing or carrying instruction(s) and/or data.

As shown in FIG. 5A, the power supply 110 supplies a voltage $V_{BAT}$ to the heater control circuit 515, the charge control circuit 520 and the light article 114. Based on the voltage $V_{BAT}$ and data from the microprocessor 502 to the light article 114, the light article 114 produces a light or series of lights indicating a status of the e-vaping device 10.

The heater control circuit 515 and the charge control circuit 520 are controlled by the microprocessor 502 and transmit/receive data to and from the microprocessor 502.

More specifically, the heater control circuit 515 is configured to control a voltage supplied to the heater of the first section 50 based on a pulse-width modulation signal and enable signal from the microprocessor 502. For example, when the microprocessor 502 detects that the first section 50 and 100 are connected and an adult vaper has applied a negative pressure, the heater control circuit 515 is configured to supply a voltage to the heater and monitor a voltage of the across the heater and a current across the heater. The heater control circuit 515 is configured to feedback the monitored voltage and current across the heater. The microprocessor 502 is then configured to adjust the pulse-width modulation signal based on the feedback from the heater control circuit 515.

The charge control circuit 520 acts as an interface between an external charger and the second section 100. More specifically, upon connecting to the charger, the charger sends a series of voltage pulses to the charge control circuit 520. The microprocessor 502 determines whether the series of voltage pulses is a correct series. If the series is determined by the microprocessor 502 to be correct, the microprocessor 502 instructs the charge control circuit 520 to generate a responding series of voltages such that if the charger sees the correct response, the charger begins charging the power supply 110.

The BMU 510 monitors a voltage $V_{BAT}$ generated by the power supply 110. If the voltage $V_{BAT}$ is within a set range, the BMU 510 supplies the voltage $V_{BAT}$ to the microprocessor 502. If the voltage $V_{BAT}$ is not within the set range, the BMU 510 prevents power being supplied to the microprocessor 502. For example, the BMU 510 does not allow the battery to be discharged when below 2.5V and cannot be charged above 4.3V.

The microprocessor 502 includes a voltage regulator to convert the voltage $V_{BAT}$ to another voltage $V_{DD}$. The microprocessor 502 supplies the voltage $V_{DD}$ to the pressure sensor 525.

The pressure sensor 525 is a microelectromechanical system (MEMS) sensor that is a true pressure sensor. More specifically, the MEMS pressure sensor 525 does not compare a differential between an ambient and non-ambient pressure. The microprocessor 502 uses the MEMS pressure sensor 525 to determine whether an adult vaper has applied a negative pressure on the e-vaping device 10. When the microprocessor 502 detects an adult vaper applying a negative pressure, the microprocessor 502 controls the heater control circuit 515 to begin a heating process for the heater to create a vapor by vaporizing the pre-vapor formulation.

Some e-vaping devices use a differential pressure sensor. Differential pressure sensors measure two air pressures, one ambient and one that changes. The differential pressure sensor is generally set on an end of the device and put into a gasket that seals one side of the sensor from another side of the sensor. When an adult vaper applies a negative pressure, the sealed side of the differential pressure sensor detects a pressure drop (vacuum), while the ambient side detects less of a drop due to the exposure by not being sealed. The differential pressure sensor then provides a differential signal.

By using a true MEMS pressure sensor 525, the microprocessor 502 determines a negative pressure from an adult vaper faster because the microprocessor 502 does not have to wait for a differential to be detected. Moreover, the MEMS pressure sensor 525 occupies less space than a differential pressure sensor because the MEMS pressure sensor 525 can be mounted directly on the PCB 116.

The MEMS pressure sensor 525 may be an MS5637-02BA03 Low Voltage Barometric Pressure Sensor, for example.

The MEMS pressure sensor 525 and the microprocessor 502 communicate using an Inter-Integrated Circuit (I²C) interface.

Figure 5B:
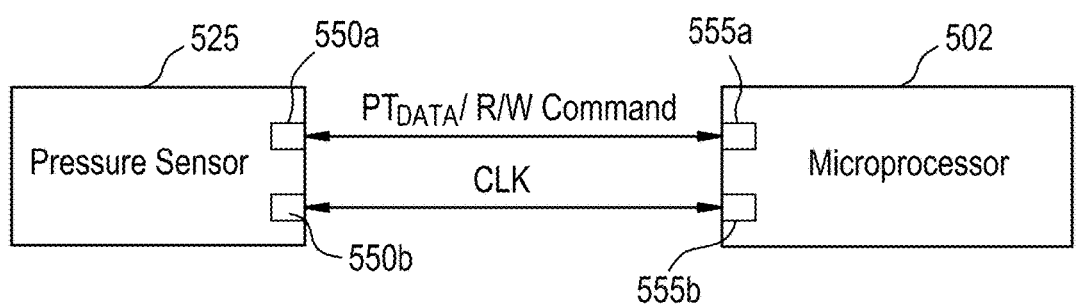
FIG. 5B illustrates a more detailed view of a connection between a microprocessor and a MEMS pressure sensor of FIG. 5A.

FIG. 5B illustrates a more detailed view of a connection between the microprocessor 502 and the MEMS pressure sensor 525. The MEMS pressure sensor 525 can measure temperature and pressure within the e-vaping device 10. As shown, the MEMS pressure sensor 525 includes an I/O pin 550a for transmitting pressure and temperature data $PT_{DATA}$ and receiving read and write requests (R/W Command) and an input pin 550b for receiving a clock CLK from the microprocessor 502. The microprocessor 502 includes an I/O pin 555a for receiving pressure and temperature data $PT_{DATA}$ and transmitting the read and write requests (R/W Command) to the MEMS pressure sensor 525 and an output pin 555b for transmitting the clock CLK.

Thus, the pressure and temperature data $PT_{DATA}$ can include at least one of a pressure measurement and a temperature measurement.

It should be understood that the MEMS pressure sensor 525 and the microprocessor 502 include other pins/ports. Therefore, that the MEMS pressure sensor 525 and the microprocessor 502 are not limited to FIG. 5B.

The MEMS pressure sensor 525 measures the ambient pressure in accordance with a frequency of the clock CLK. The MEMS pressure sensor 525 sends the measured pressure to the microprocessor 502 in the pressure data $PT_{DATA}$ in accordance with a frequency of read requests (R/W Command).

The microprocessor 502 controls the frequency of read requests based on a determined operating mode of the e-vaping device 10. Thus, the microprocessor 502 controls a sampling rate of the pressure from the MEMS pressure sensor 525 by controlling the frequency of read requests.

More specifically, the e-vaping device 10 may operate in various operating modes to save power. For example, the e-vaping device 10 may operate in an active mode, a middle mode and a hibernation mode.

The heater control circuit 515 and the microprocessor 502 cooperatively operate to determine whether the second section 100 is connected to the first section 50. When the microprocessor 502 determines that the second section 100 and the first section 50 are not connected or an adult vaper has applied a positive pressure over a disabling threshold difference of the baseline for a threshold time, the microprocessor 502 may operate the second section 100 in the hibernation mode. Therefore, the microprocessor 502 may reduce the frequency of the read requests to a lower frequency, for example, 10 Hz. In an example, the disabling pressure difference may be 225-300 Pa and the threshold time for applying the positive pressure may be three seconds.

If the microprocessor 502 determines that an adult vaper has applied a negative pressure within a threshold period of time and the second section 100 and the first section 50 are connected, the microprocessor 502 may operate the e-vaping device 10 in the active mode. In the active mode, the microprocessor 502 may control the frequency of the read requests to be a higher frequency, for example, 100 Hz. Other triggers the microprocessor 502 may use for placing the e-vaping device 10 in the active mode include detecting a connection to the cartridge and removal of the e-vaping device 10 from an external charger.

If the microprocessor 502 determines that an adult vaper has not applied a negative pressure within a threshold period of time and the second section 100 and the first section 50 are connected, the microprocessor 502 may operate the e-vaping device 10 in the middle mode. In the middle mode, the microprocessor 502 may control the frequency of the read requests to be between the frequency associated with the active mode and the frequency associated with the hibernation mode, for example, 50 Hz.

The possible operating modes and associated read request frequencies may be stored as a table in the storage medium 505.

The microprocessor 502 may determine whether an adult vaper has applied a negative pressure on the e-vaping device 10 by comparing the pressure measured by the MEMS pressure sensor 525 (identified in the pressure and temperature data $PT_{DATA}$) to a baseline pressure. If the microprocessor 502 determines that the measured pressure differs from the baseline pressure by a initialization threshold difference, the microprocessor 502 determines that an adult vaper has applied a negative pressure and the microprocessor 502 initializes the vaporizing process (i.e., controlling the heater to produce a vapor). In an example embodiment, the initialization threshold difference may be 150 Pa.

Moreover, after initializing the vaporizing process, the microprocessor 502 continues to monitor the measured pressure from the MEMS pressure sensor 525. If the microprocessor 502 determines that the measured pressure differs from the baseline pressure by an terminating threshold difference, the microprocessor 502 ends the vaporizing process (i.e., reduces the voltage to the heater so as to not produce a vapor such as 0V). In an example embodiment, the terminating threshold difference may be 75 Pa.

The baseline pressure is a rolling average and may be updated periodically by the microprocessor 502. For example, the microprocessor 502 may calculate the baseline pressure every second based on the samples that occurred after the previous calculation.

By using a baseline pressure, the microprocessor 502 avoids incorrect determinations. For example, the baseline pressure allows the microprocessor 502 to compensate for changing barometric pressures such as when the weather changes (e.g., a thunderstorm). Thus, the microprocessor 502 does not inadvertently activate the heater when the barometric pressure changes due to the weather and when moving from between indoor spaces having different pressures.

To avoid the negative pressure applied by the adult vaper affecting the baseline pressure, the microprocessor 502 uses a guard band. For example, the microprocessor 502 may disregard pressure measurements within a threshold time of detecting the negative pressure from the adult vaper.

Moreover, the microprocessor 502 may use a pre-trigger threshold to prevent the baseline from being updated. More specifically, if the measured pressure from the MEMS pressure sensor 525 is within the pre-trigger threshold difference of the baseline, the microprocessor 502 may updated the baseline pressure. However, the measured pressure from the MEMS pressure sensor 525 is within the pre-trigger threshold difference of the baseline, the microprocessor 502 does not update the baseline pressure. For example, the pre-trigger threshold difference may be 60 Pa.

In addition to activating the heater when the microprocessor 502 detects a negative pressure from the adult vaper, the microprocessor 502 may limit a maximum length of vapor drawn and limit a number of times of vapor being drawn within a time limit (e.g., 10 seconds).

Figure 6:
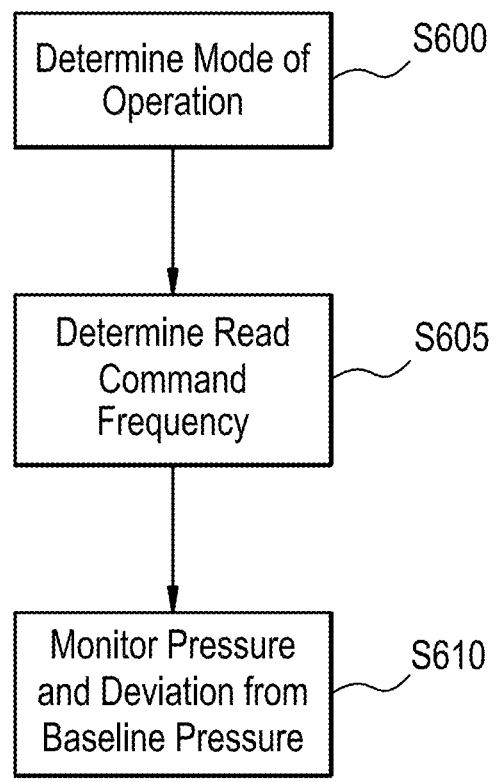
FIG. 6 illustrates a method of detecting a threshold pressure change according to an example embodiment.

FIG. 6 illustrates a method of detecting a threshold pressure change within an e-vaping device according to an example embodiment. The method of FIG. 6 may be performed by the microprocessor 502.

At S600, the microprocessor 502 determines a mode of operation. For example, the microprocessor 502 may operate in an active mode, a middle mode and a hibernation mode.

At S605, the microprocessor 502 determines a read request frequency associated with the operation mode. For example, the microprocessor 502 may access a table to obtain the read request frequency associated with the determined mode of operation.

At S610, the microprocessor monitors the pressure data, including pressure measurements, from the MEMS pressure sensor 525 and compares the pressure measurements to the baseline pressure. If one of the pressure measurements differs from the baseline pressure by a threshold amount, the microprocessor 502 initiates the vaporizing process.

Figure 7:
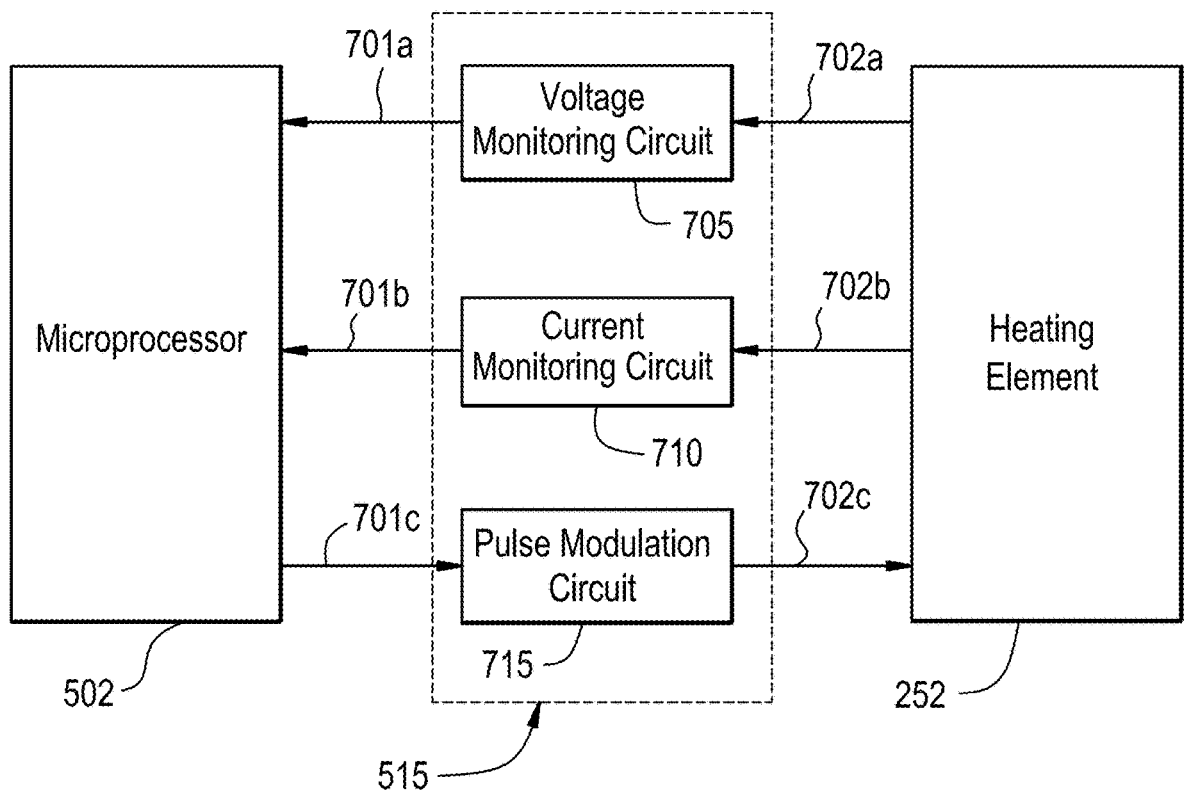
FIG. 7 is a block diagram illustrating an example embodiment of a heater control circuit.

FIG. 7 is a schematic illustrating a coupling of the microprocessor 502, the heater control circuit 515 and the heating element 252. As shown in FIG. 7, the microprocessor 502 and the heater control circuit 515 may be coupled via interfaces 701a, 701b and 701c. And the heating element 252 and the heater control circuit 515 may be coupled via interfaces 702a, 702b and 702c. The interfaces 701a, 701b and 701c may be one or more pins. The interfaces 702a, 702b and 702c may be the positive contact 120 and the common contact 122, as described above with reference to FIG. 4.

The heater control circuit 515 includes a voltage monitoring circuit 705 and a current monitoring circuit 7100. The heater control circuit 515 also includes a pulse modulation circuit 715. It will be understood that the heater control circuit 515 may include other circuits as well, but those other circuits have been omitted for the sake of brevity. The voltage monitoring circuit 705 may be a voltage detector. The current monitoring circuit 710 may be a current detector.

The voltage monitoring circuit 705 is coupled to the microprocessor 502 via the interface 701c and the voltage monitoring circuit 705 is coupled to the heater 252 via the interface 702a. The current monitoring circuit 710 is coupled to the microprocessor 502 via the interface 701b and the current monitoring circuit 710 is coupled to the heater 252 via the interface 702b. The pulse modulation circuit 715 is coupled to the microprocessor 502 via the interface 701c and the pulse modulation circuit 715 is coupled to the heater 252 via the interface 702c.

Operation of a heater control circuit according to an example embodiment will now be described.

Figure 8:
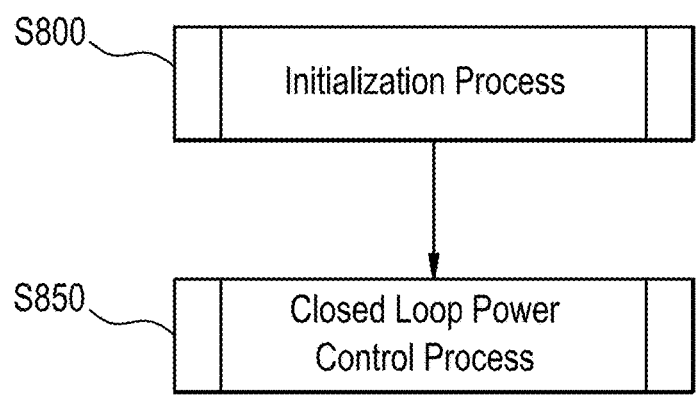
FIG. 8 illustrates a method of controlling power delivery to a heating element or heater.

FIG. 8 illustrates a method of controlling power delivery to a heating element or heater (e.g., the heating element 252). As shown in FIG. 8, at step S800, the controller 500 performs an initialization process, which is discussed in detail with respect to FIG. 9. At step 850, the controller 500 performs a closed loop power control process, which is discussed in detail with respect to FIG. 10.

Figure 9:
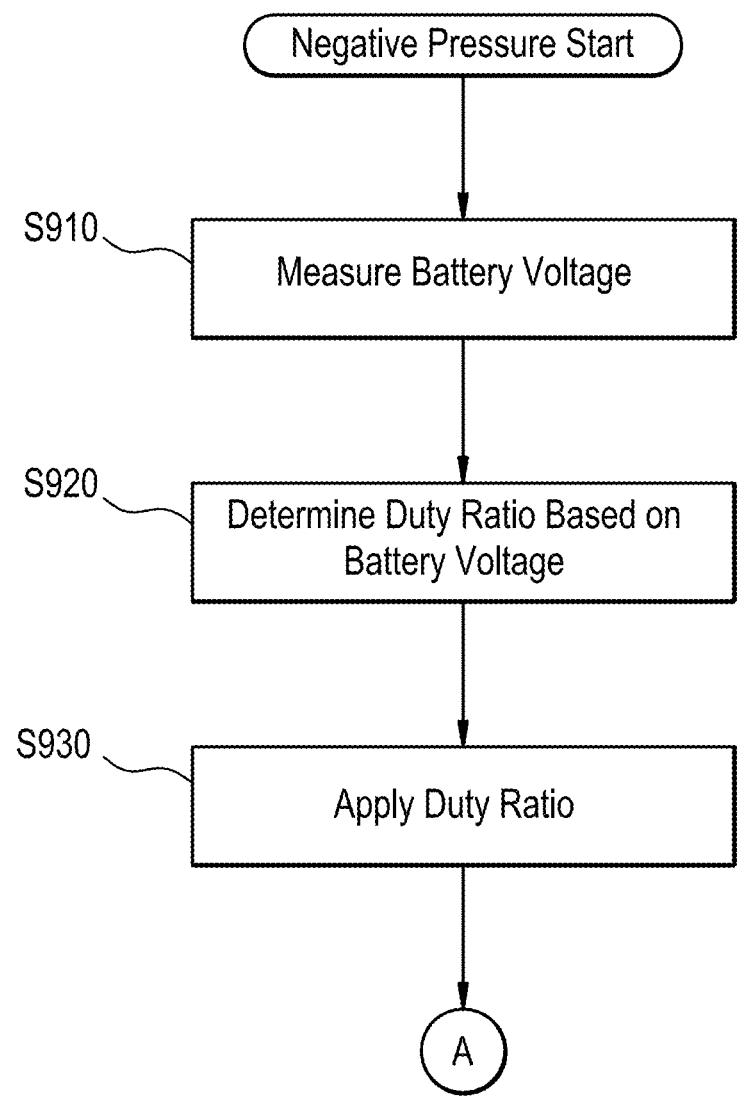
FIG. 9 illustrates the initialization process of FIG. 8 according to an example embodiment.

FIG. 9 illustrates the initialization process of FIG. 8 according to an example embodiment. As shown, the initialization process starts when the controller 500 detects a negative pressure (e.g., detects, using the MEMS pressure sensor 525, an adult vaporer has applied a negative pressure on the e-vaping device 10). The controller 500 then measures the voltage of the power supply 110 in step S910. For example, the microprocessor 502 receives a sample of the battery voltage from the battery monitoring unit 510.

At step S920, the controller 500 determines a duty ratio based on the battery voltage. For example, the microprocessor 502 obtains a desired power from the storage medium 505. The desired power may be a design parameter, empirically determined, and pre-stored in the storage medium 505 by a manufacturer. In one example embodiment, the desired power may be 3.9 W. The microprocessor 502 also obtains a start resistance $R_{start}$ from the storage medium 505. The start resistance is an assumed resistance for the heater 252. The start resistance may be a design parameter, empirically determined, and pre-stored in the storage medium 505 by a manufacturer. The start resistance may be 3.5 Ohms. The microprocessor 502 uses the measured battery voltage, the desired power and the start resistance to determine the duty ratio (DR) (or duty cycle) according to the following equation:

$$DR_{n-1} = \frac{(\text{Desired Power})(R_{Start})}{V_{BAT}^2} \qquad (1)$$

where $DR_{n-1}$ is the duty ratio determined using equation (1) and $V_{BAT}$ is the measured battery voltage.

At step S930, the controller 500 applies power to the heater 252 according to the determined duty ratio $DR_{n-1}$. For example, the microprocessor 502 controls the power modulation circuit 715 to provide a pulse width modulated power signal to the heater 252 according to the determined duty ratio.

Figure 10:
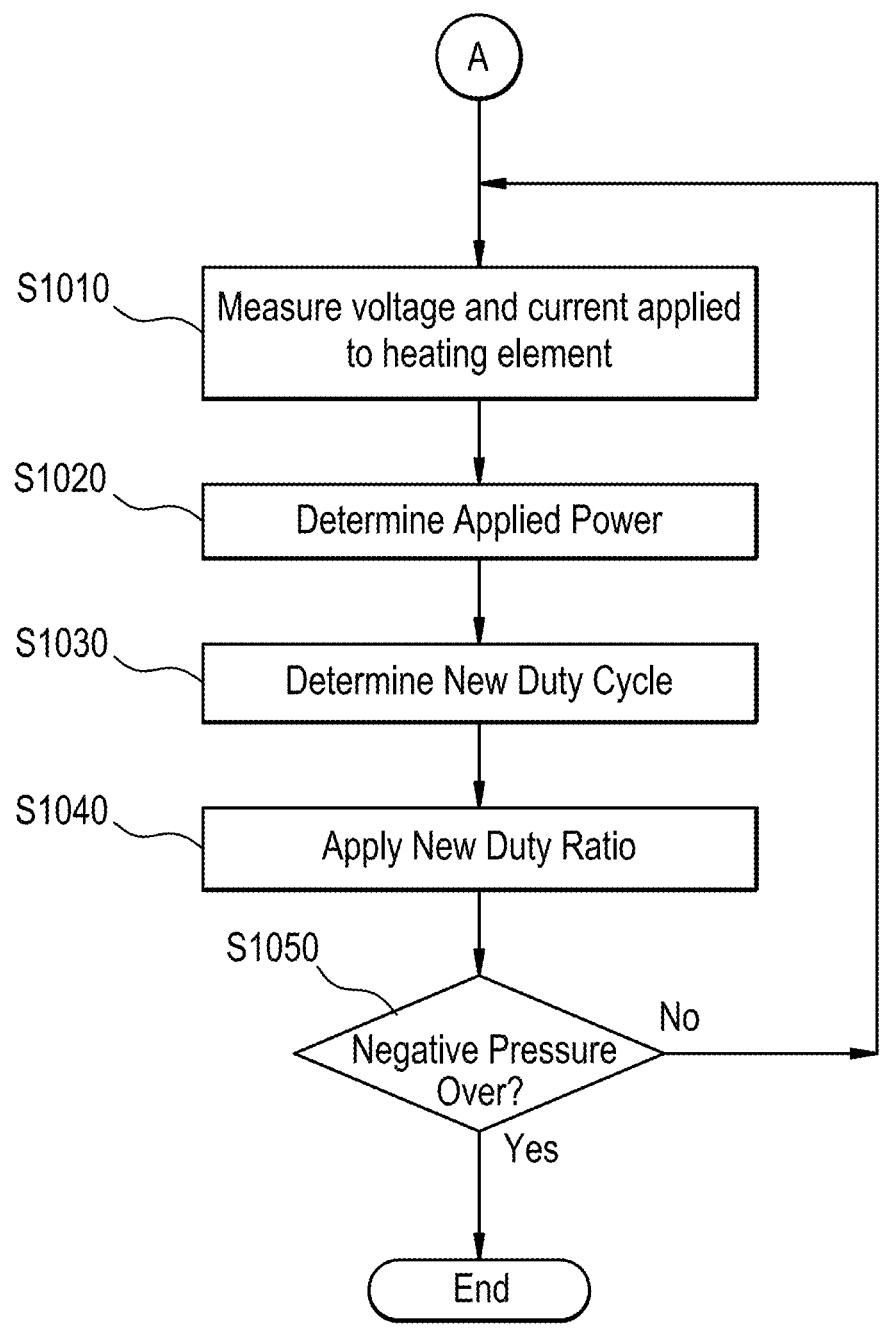
FIG. 10 illustrates a flow chart of the closed loop power control process in FIG. 8 according to an example embodiment.

FIG. 10 illustrates a flow chart of the closed loop power control process in FIG. 8 according to an example embodiment. As shown, in step S1010, the controller 500 measures voltage and current applied to the heating element 252. For example, the voltage monitoring circuit 705 samples a filtered (e.g., average) voltage across the heater 252 and the current monitoring circuit 710 samples a filtered (e.g., average) current through the heater 252. The microprocessor 502 receives the voltage measurement from the voltage measuring circuit 705 and the current measurement from the current measuring circuit 710. As will be appreciated, these and any other measurements received by the microprocessor 502 undergo an analog-to-digital conversion. The microprocessor 502 may store the measured voltage and the measured current in the storage medium 505.

At step S1020, the controller 500 determines power applied to the heater 252. For example, the microprocessor 502 calculates the applied power ($\text{Power}_{Applied}$) using the following equation:

$$\text{Power}_{Applied} = \frac{V_{Sample} * I_{Sample}}{DR_{n-1}} \qquad (2)$$

where $V_{Sample}$ is the measured voltage from the voltage monitoring circuit 705 and $I_{Sample}$ is the measured current from the current measuring circuit 710.

At step S1030, the controller 500 determines a new duty ratio $DR_n$ for use in applying power to the heater 252. For example, the microprocessor 502 determines the new duty ratio according to the following equation:

$$DR_n = \frac{(\text{Desired Power}) * DR_{n-1}}{\text{Power}_{Applied}}. \qquad (3)$$

The microprocessor 502 stores the new duty ratio $DR_n$ in the storage medium 505.

In step S1040, the controller 500 continues the application of power to the heater 252, but does so according to the new duty ratio $DR_n$. For example, the microprocessor 502 controls the power modulation circuit 715 to provide a pulse width modulated power signal to the heater 252 according to the new duty ratio.

At step S1050, the controller 500 determines whether the negative pressure has ended. For example, the microprocessor 502 receives pressure information from the MEMS pressure sensor 525 and determines whether the amount of negative pressure triggering negative pressure detection falls below a threshold amount. If the microprocessor 502 determines that the negative pressure has not ended, then processing returns to step S1010. As will be appreciated, in this next iteration, the duty ratio $DR_{n-1}$=the new duty ratio $DR_n$ from the previous iteration. However, if the negative pressure has ended, then the process ends.

In one example embodiment, the cycle time for the initialization process and the cycle time for one iteration of the closed loop power control process may be equal. However, example embodiments are not limited to these processes having equal cycle times. In one example embodiment, the cycle time may be 60-80 ms. However, the example embodiments are not limited to these values.

As will be appreciated, the method of FIGS. 8-10 is repeated for each application of a negative pressure on the e-vaping device. In one embodiment, after a first negative pressure, the start resistance may be determined as the last measured voltage across the heater 252 divided by the last measured current applied to the heater 252.

In an alternative embodiment, the process of FIGS. 8-10 may be based on a desired voltage for application to the heater 252 instead of a desired power. The desired voltage may be a design parameter, empirically determined, and pre-stored in the storage medium 505 by a manufacturer. For example, instead of determining the new duty ratio according to equation (3), the new duty ratio may be determined according to equation (4) below:

$$DR_n = \frac{(\text{Desired Voltage}) * DR_{n-1}}{V_{sample}}. \qquad (4)$$

In yet another alternative example embodiment, the process of FIGS. 8-10 may be based on a desired current for application to the heater 252 instead of a desired power. The desired current may be a design parameter, empirically determined, and pre-stored in the storage medium 505 by a manufacturer. For example, instead of determining the new duty ratio according to equation (3), the new duty ratio may be determined according to equation (5) below:

$$DR_n = \frac{(\text{Desired Current}) * DR_{n-1}}{I_{sample}}. \qquad (5)$$

In yet another example embodiment, the storage medium 505 may store a desired power profile. The desired power profile provides a desired power corresponding to each iteration of the closed loop power control process. Accordingly, the desired power may be changed over the course of the closed loop power control process. Also, the same desired power profile may be used for each application of a negative pressure, or each application of a negative pressure may have a corresponding desired power profile stored in the storage medium 505.

Figure 11:
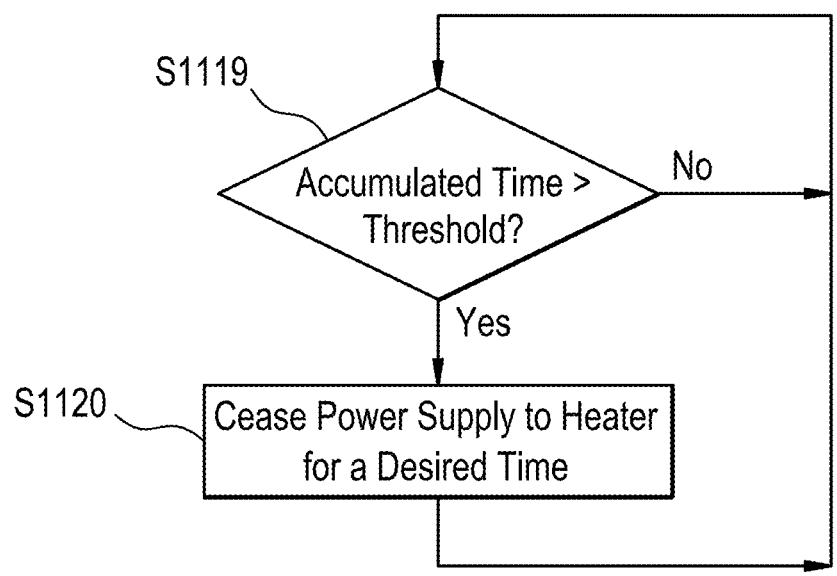
FIG. 11 illustrates a flowchart for mitigating against over-heating the heating element.

FIG. 11 illustrates a flowchart for mitigating against over-heating the heating element 252. During operation, the controller 500 accumulates an amount of time the heater 252 is supplied power over a moving window of time. For example, the microprocessor 502 may include a timer for measuring time, and, based on the power control described above with respect to FIGS. 8-10, the microprocessor 502 knows the amount of time power has been applied to the heater element 252 over the moving window of time. The moving window of time may be a design parameter, empirically determined, and stored in the storage medium 505. In one embodiment, the moving window of time is 7 seconds.

As shown in FIG. 11, at step S1119, the controller 500 (e.g., the microprocessor 502) determines if the accumulated time exceeds a time threshold. The time threshold may be a design parameter, empirically determined, and stored in the storage medium 505. In one embodiment, the time threshold is 5 seconds. If the controller 500 determines the threshold has been exceeded, then the controller 500 ceases supplying power to the heater 252 for a desired period of time in step S1120. The desired period of time may be a design parameter, empirically determined, and stored in the storage medium 505. In one embodiment, the desired period of time equals the time threshold; however, example embodiments are not limited to this. If the accumulated time does not exceed the time threshold, processing repeatedly loops back to step S1119.

In yet another embodiment, the controller 500 may apply a 100% duty ratio of power to the heater 252 for a short period of time (e.g., only a few milliseconds). This may occur when the cartridge section 50 is attached, at a first application of negative pressure, etc. The controller 500 measures the voltage and current across the heater 252, and determines the resistance of the heater 252. If the resistance is outside a desired range, then the cartridge 50 is identified as invalid, and no further power will be supplied to the cartridge 50. The desired may be a design parameter, empirically determined, and stored in the storage medium 505. For example, the desired range may be 2 to 5 Ohms.

Figure 12:
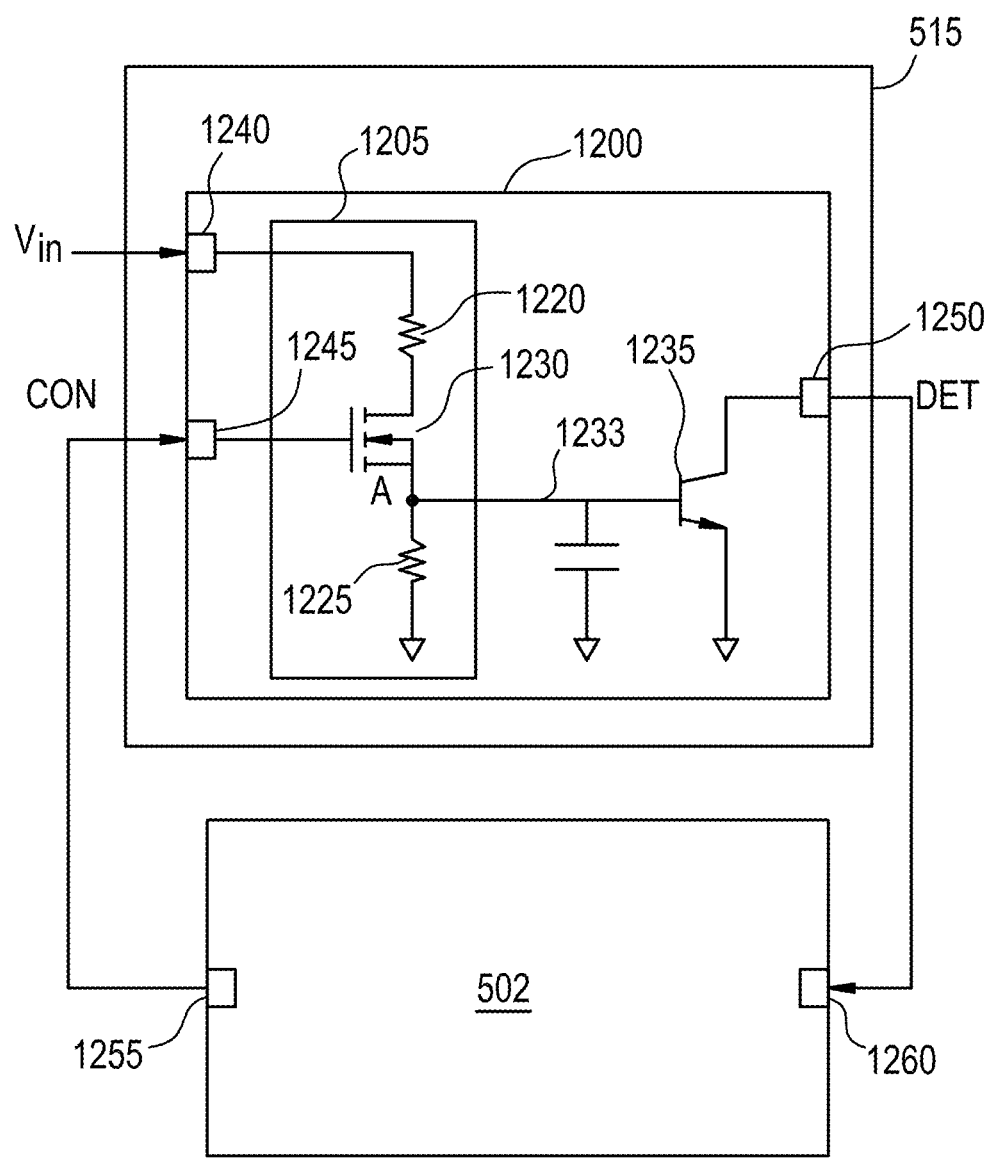
FIG. 12 illustrates an example embodiment of the heater control circuit and microprocessor shown in FIG. 5.

FIG. 12 illustrates an example of the heater control circuit and microprocessor shown in FIG. 5A. With reference to FIG. 12, the microprocessor 502 may include terminals 1255 and 1260 while the heater control circuit 515 includes terminals 1240, 1245, and 1250. The microprocessor 502 may output a control signal CON from terminal 1255 to terminal 1245. The heater control circuit 515 may include a cartridge detector 1200. An input signal (or input voltage) Vin may be input into the cartridge detector 1200 at terminal 1240 of the cartridge detector 1200. The terminal 1240 may be electrically connected to the anode 102 of the female connecting portion 106 through, for example, wire 128 (see FIG. 3A) or other electrical connections on the circuit board 116.

The cartridge detector 1200 may generate a detection signal DET for detecting attachment events. The attachment events indicate an attachment to (or electrical connection) or detachment from (or electrical disconnection of) between the first section (or cartridge section) 50 and the second section (or power supply section) 100. In other words, the attachment events indicate an attachment state of the first section 50 and the second section 100. The cartridge detector 1200 may output the detection signal DET at terminal 1250 to terminal 1260 of the microprocessor 502. The microprocessor 502 may detect attachments events based on the detection signal DET in accordance with the description of FIG. 13 below.

With reference to FIG. 12, the cartridge detector 1200 may include a voltage divider 1205. The voltage divider 1205 may include a resistive element 1220 (or first resistive element), a resistive element 1225 (or second resistive element), and a switching element 1230 (or a first switching element). The cartridge detector 1200 may also include a switching element 1235 (or second switching element). The switching element 1230 may be a transistor, for example, an enhancement mode n-channel metal-oxide-semiconductor field effect transistor (MOSFET). A gate terminal of the switching element 1230 may be connected to terminal 1245. A source of the switching element 1230 may be connected to the resistive element 1220, and a drain of the switching element 1230 may be connected to the resistive element 1225 at node A. That is, the resistive elements 1220 and 1225 and the switching element 1230 may be connected in series. The resistive elements 1220 and 1225 may be resistors having desired resistance values. For example, the resistive elements 1220 and 1225 may have a same resistance value (e.g., 10 kΩ).

The terminal 1245 may receive a control signal CON from the microprocessor 502. The control signal CON may be a signal that switches the switching element 1230 on and off. Thus, the presence or absence of the output voltage of the voltage divider 1205 at node A is controlled by the control signal CON. The microprocessor 502 may generate the control signal CON to have a desired frequency and amplitude. The desired frequency and amplitude may be defined by an adult vaper and/or based on empirical evidence.

In view of the above, it may be said that the resistive elements 1220 and 1225 and the switching element 1230 form a series voltage divider circuit with a dual resistance, whose output signal (or output voltage) at node A is controlled by the control signal CON applied to switching element 1230.

The cartridge detector 1200 may include the switching element (or second switching element) 1235. The switching element 1235 may be a NPN bipolar junction transistor (BJT). A base of the switching element 1235 may be connected to node A. An emitter of the switching element 1235 may be connected to a common voltage (e.g., a ground voltage). A collector of the switching element 1235 may be connected to the terminal 1250. The cartridge detector 1200 may include a capacitive structure 1233 to facilitate operation of the switching element 1235.

With reference to FIG. 12, the input signal Vin at terminal 1240 may vary based on whether the first section 50 is attached to or detached from the second section 100. For example, if the first section 50 is detached from the second section 100, then the input signal Vin may have a low voltage level (or a first voltage level), for example, 0V. If the first section 50 is attached to the second section 100 (thereby electrically connecting the female connecting portion 220 to cathode portion 106a and electrically connecting the male anode 208 and the female anode 102), the input signal Vin at terminal 1240 may have a higher voltage level (or a second voltage level), due to the electrical connection to the power supply 110 (described above with reference to FIGS. 3A-3D). For example, if the first section 50 and the second section 100 are attached, the input signal Vin at terminal 1240 may be the voltage of the power supply 110.

From the circuit diagram in FIG. 12, it should be understood that the switching element 1235 may switch on and off according to the output voltage of the voltage divider 1205 at node A. For example, if the voltage at node A is above a threshold voltage of the switching element 1235, the switching element 1235 turns on to connect terminal 1250 to a common voltage (or ground voltage). Here, the detection signal DET is pulled into a low state in which the microprocessor 502 detects that the first section 50 is attached to the second section 100. If the voltage at node A is less than the threshold voltage, the switching element 1235 turns off and the detection signal DET returns to a high state in which the microprocessor 502 detects that the first section 50 is detached from the second section 100.

Figure 13:
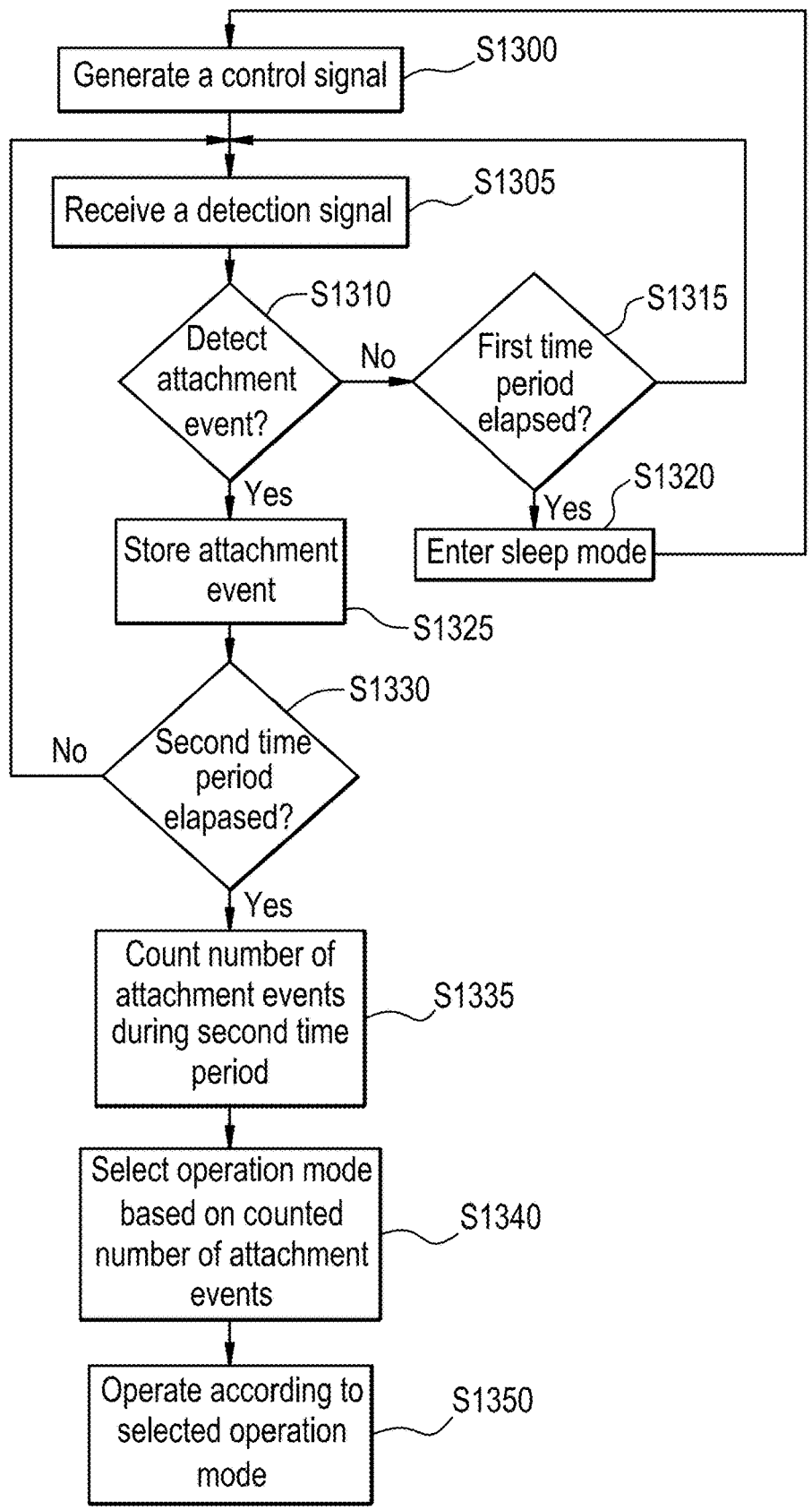
FIG. 13 is a flow chart illustrating an example method of operating the microprocessor shown in FIGS. 5A and 12.

FIG. 13 is a flow chart illustrating an example method of operating the microprocessor shown in FIGS. 5 and 12. FIG. 13 will be described with reference to FIGS. 1-5A and 12.

In operation S1300, the microprocessor 502 generates a control signal CON for controlling detection of whether a cartridge section 50 is connected to a power supply section 100. The microprocessor 502 may generate the control signal CON based on input from the adult vaper and/or empirical evidence. For example, the microprocessor 502 may generate the control signal CON such that the switching element 1230 sends an output voltage of the voltage divider 1205 to node A at a desired frequency. The desired frequency and amplitude of the control signal CON may be defined by the adult vaper and/or based on empirical evidence.

In operation S1305, the microprocessor 502 receives a detection signal DET based on the control signal CON at terminal 1260. For example, the microprocessor 502 receives the detection signal DET in accordance with an activation and deactivation of the switching element 1230, which is controlled by the control signal CON.

In operation S1310, the microprocessor 502 detects attachment events based on the detection signal DET. The attachment events indicate whether the cartridge section 50 is attached to or detached from the power supply section 100. For example, if the output voltage of the voltage divider 1205 at node A is above a threshold voltage of the switching element 1235, the switching element 1235 turns on to connect terminal 1250 to a common voltage (or ground voltage). Here, the detection signal DET is pulled into a low state in which the microprocessor 502 detects that the first section 50 is attached to the second section 100. If the output voltage at node A is less than the threshold voltage, the switching element 1235 turns off and the detection signal DET returns to a high state in which the microprocessor 502 detects that the first section 50 is detached from the second section 100. The microprocessor 502 may detect an attachment event by comparing a previous attachment state of the first section 50 and the second section 100 to a current attachment state of the first section 50 and the second section 100. For example, the microprocessor 502 may detect an attachment event if the comparison indicates that an attachment state of the first section 50 and the second section 100 has changed from attached to detached or vice versa.

If the microprocessor 502 does not detects an attachment event in operation S1310, then the microprocessor 502 performs operation S1315 and determines whether a first time period has elapsed since a most recently detected attachment event. The first time period may be defined by the adult vaper and/or based on empirical evidence. If the first time period has not elapsed, then the microprocessor 502 returns to operation S1305. If the first time period has elapsed, then the microprocessor 502 places the e-vaping device 10 into a sleep mode (or hibernate mode). The sleep mode may be a mode of the e-vaping device 10 in which the microprocessor 502 disables a pressure sensor (e.g., pressure sensor 525) of the e-vaping device 10 (e.g., the microprocessor 502 may turn the pressure sensor off or terminate the sending of read requests to the pressure sensor so that the sensed pressure is not sent to the microprocessor 502). Alternatively, in the sleep mode, the microprocessor 502 may reduce a frequency of sending read requests to the pressure sensor (compared to other modes of operation such as an active mode and a standby mode). This may reduce (or alternatively, prevent) occurrences of accidental operation of the e-vaping device 10 due to, for example, ambient pressure drops that would otherwise activate the pressure sensor. The microprocessor 502 may then return to operation S1300 to generate the control signal CON. Thus, even in the sleep mode, the microprocessor 502 continues to check for attachment events of the first section 50 and the second section 100.

If, in operation S1310, the microprocessor 502 detects an attachment event, then the microprocessor 502 performs operation S1325 and stores the detected attachment event in the storage medium 505. The microprocessor 502 may store detected attachment events in a table that includes an indication of whether a detected attachment event relates to an attachment or detachment of the first section 50 and the second section 100 and an associated time stamp. These stored attachment events may be used for subsequent data collection. The attachment events may also trigger different modes of the microprocessor 502 (see discussion of operations S1325-S1350 below).

In operation S1330, the microprocessor 502 determines whether a second time period has elapsed since the most recent attachment event. If not, then the microprocessor 502 returns to operation S1305 to detect possible additional attachment events within the second time period. The second time period may be defined by the adult vaper and/or based on empirical evidence.

If the second time period has elapsed in operation S1330, then the microprocessor 502 may count the number of attachment events during the second time period in operation S1335 (e.g., by accessing the storage medium 505 with stored attachment events). In operation S1340, the microprocessor 502 may select from among different modes of operation for the e-vaping device based on the counted number of attachment events. The different modes of operation may include the sleep mode (or hibernate mode) and different modes based on profiles associated with different operating preferences. The profiles may include information used to operate the controller 500 according to operating preferences of an adult vaper. For example, two attachment events within the second time period may cause the controller 500 to operate according to a first profile associated with a first set of operating preferences. Three attachment events within the second time period may cause the controller 500 to operate according to a second profile associated with a second set of vaping preferences. The operating preferences may include information used to adjust durations of the first and second time periods and/or other desired controllable parameters of the e-vaping device 10. The profiles may be defined by the adult vaper and/or based on empirical evidence.

In operation S1350, the microprocessor 502 may operate according to the selected mode of operation.

Figure 14:
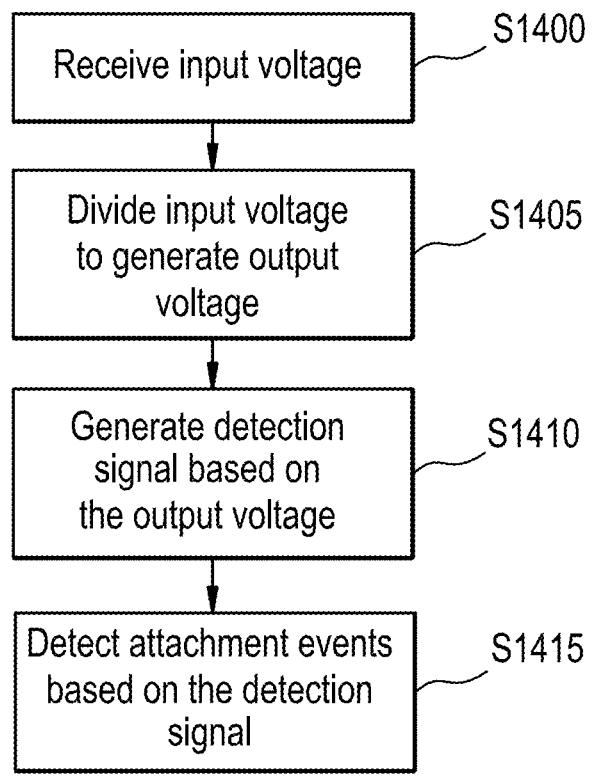
FIG. 14 is a flow chart illustrating an example method of operating the controller shown in FIG. 5A.

FIG. 14 is a flow chart illustrating an example method of operating the controller shown in FIG. 5A. FIG. 14 is discussed below with reference to FIGS. 1-5A and 12-13.

In operation S1400, the cartridge detector 1200 of the controller 500 may receive an input voltage from an anode (e.g., female anode 102) of a connecting portion (e.g., female connecting portion 106) of the power supply section 100. The connecting portion detachably connects the power supply section 100 to a cartridge section 200. The input voltage may correspond to Vin from FIG. 12.

In operation S1405, the cartridge detector 1200 may divide the input voltage to generate an output voltage. For example, the cartridge detector 1200 may include a voltage divider 1205 to divide the input voltage Vin to generate an output voltage at node A.

In operation S1410, the cartridge detector may generate a detection signal (e.g., detection signal DET) based on the output voltage.

In operation S1415, the microprocessor 502 may detect attachments events based on the detection signal, the attachment events indicating whether the cartridge section 50 is attached to or detached from the power supply section 100. The microprocessor 502 may then operate in accordance with operations S1315-S1350 shown in FIG. 13.

Figure 15:
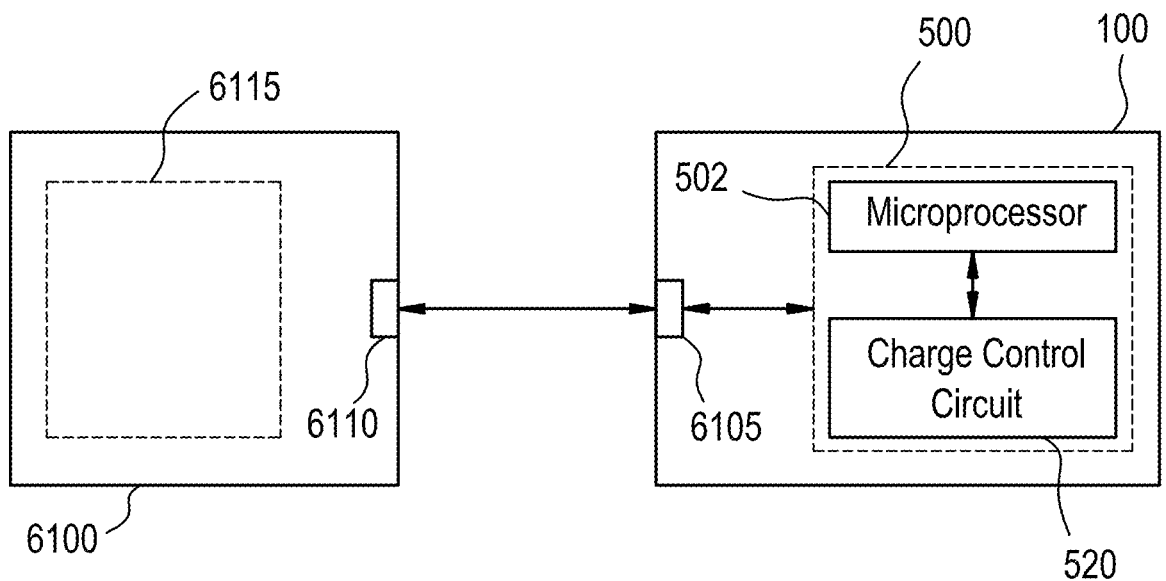
FIG. 15 is a schematic illustrating a coupling of the second section shown in FIGS. 1-4 and a charger, according to one example embodiment.

FIG. 15 is a schematic illustrating a coupling of the second section of the electronic vaping device shown in FIGS. 1-5A and a charger, according to one example embodiment. As shown in FIG. 15, the second section 100 of the electronic vaping device 10 and a charger 6100 may be coupled via interfaces 6105 and 6110. The interface 6105 may be the positive contact 120 and the common contact 122, as described above with reference to FIG. 4. The interface 6110 may be one or more pins.

The second section 100 may include one or more elements as described above with reference to FIGS. 2-4. However, for the sake of brevity, the controller 500, the microprocessor 502 and the charger control circuit 520 are shown in the second section 100 in FIG. 6. The charger 6100 may include, among other elements, a controller 6115, which will be described below with reference to FIGS. 17 and 18.

Figure 16:
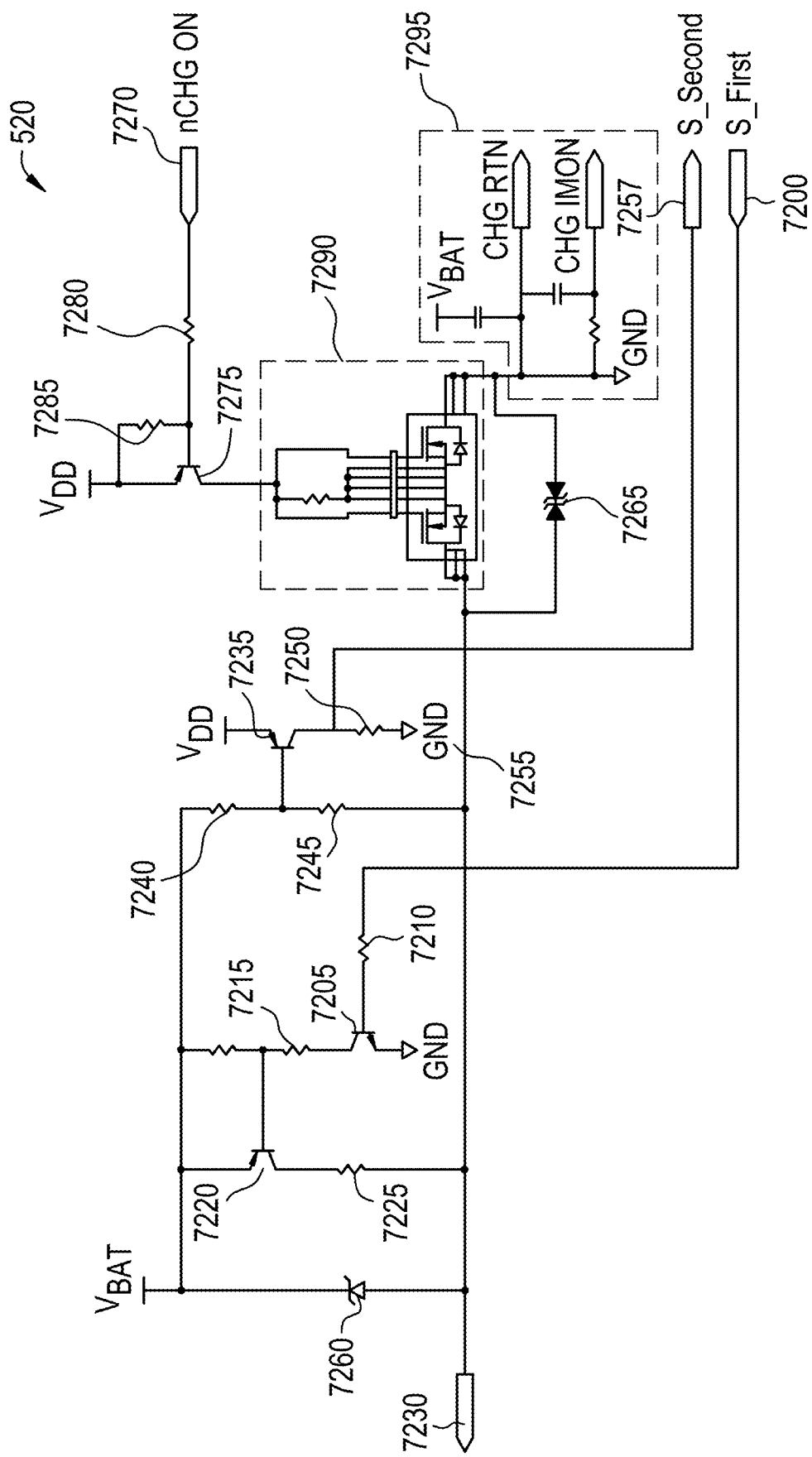
FIG. 16 illustrates a charge control circuit of FIG. 5A, according to one example embodiment.

FIG. 16 illustrates a charge control circuit of FIG. 5A, according to one example embodiment. As shown in FIG. 16, the charge control circuit 520 includes various electrical elements, which as will be discussed, enable power/electrical charge to be transferred from the charger 6100 to the power supply 110, shown in FIG. 5A.

Upon detection of coupling of the second section 100 to the charger 6100 by the charger 6100 (which will be described below), the charger 6100 provides a first signal S_First to be received by the controller 500 of the second section 100. The first S_First signal is received at the terminal 7200 of the charge control circuit 520, via the microprocessor 502 (upon being authenticated by the microprocessor 502). The first signal S_First will activate a switch 7205 after passing through the resistive element 7210. Although switch 7205 is shown to be a Bipolar Junction Transistor (BJT), example embodiments are not limited thereto and the switch 7205 may be any type of known or to be developed switch. The resistive element 7210 may serve to limit the current supplied to the base of the switch 7205. Once the switch 7205 is activated, the current passing through the resistive element 7215 activates the switch 7220. The resistive element 7215 may serve the same purpose as the resistive element 7210. The resistive element 7225 serves to prevent the electric charge, to be received from the charger 6100 through the pin 7230, to be supplied to the switch 7220.

The activation of the switch 7220 enables activation of the switch 7235 through the supply of voltage to the base of the switch 7235 via a voltage divider formed of resistive elements 7240 and 7245. The resistive element 7250 prevents the current at the collector terminal of the switch 7235 from flowing into the ground 7255.

The first signal S_First may be a series of voltage pulses switching between a low value and a high value, following the path of the first signal from the terminal 7200 to the activation of the switch 7235. Accordingly, the first signal S_First results in a periodic activation/deactivation of the switch 7235, thus generating a second series of pulses switching between a low value and a high value. A second signal S_Second, as will be described below, will then be sent back to the charger 6100, via the terminal 7257 for purposes of authenticating the second section 100 and the eventual charging of the power supply 110 by the charger 6100.

The diodes 7260 and 7265 may serve as electrostatic discharge protective elements, as is known in the art.

Upon authentication of the second section 100 by the charger 6100, a charge-on signal nCHG ON may be supplied by the microprocessor 502 to the charge control circuit 520 through the terminal 7270. The nCHG ON signal may in turn activate the switch 7275. The resistive elements 7280 and 7285 may serve as current limiting elements, as described above with respect to the other resistive elements shown in FIG. 7. Once activated, the switch 7285 activates the circuit 7290. The circuit 7290 may in turn open a path for the electric charge to be received from the charger 6100 via the terminal 7230 for charging of the power supply 110.

In one example embodiment, the circuit 7295 may provide for monitoring the charge being supplied by the charger 6100 by outputting signals CHG RTN and CHG IMON.

The switches 7205, 7220, 7235 and 7275 may be the same type of switch (e.g., a BJT transistor, a metal-oxide semiconductor field effect transistor (MOSFET), etc.) or be any of different types of known or to be developed switches.

Figure 17:
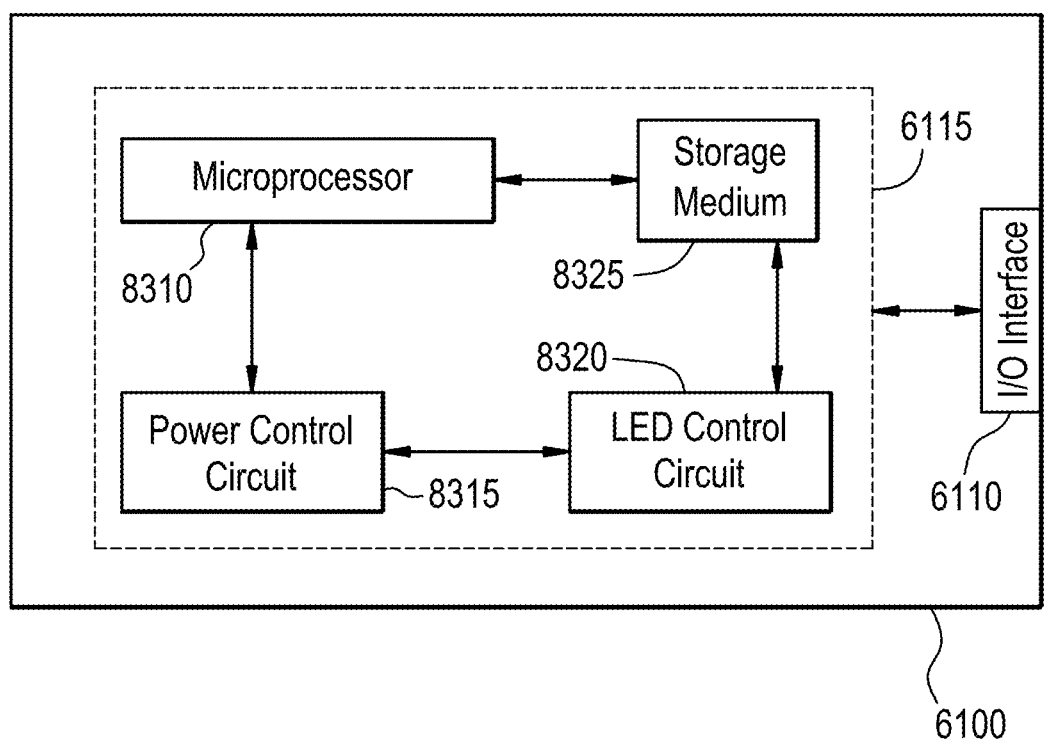
FIG. 17 illustrates a block diagram of elements on the charger shown in FIG. 15, according to an example embodiment.

FIG. 17 illustrates a block diagram of elements on the charger shown in FIG. 15, according to an example embodiment.

As shown, the charger 6100 may include the controller 6115 (as discussed above with reference to FIG. 15) and an input/output interface 6110 for connecting to external devices such as the electronic vaping device 10 or the second section 100 of the electronic vaping device 10.

The controller 6115 may include a microprocessor 8310, a power control circuit 8315, a light emission diode (LED) control circuit 8320 and a storage medium 8325. The input/output interface 610 may include one or more pins. The one or more pins may be mechanical pins vertically movable upon placement of the external device to be charged, for example the second section 100, into the charger 6100. For example, the one or more pins may be pressed inward upon placement of the external device into the charger 6100 and make contact with a magnet of the second section 100 (the positive and common contacts 120 and 122) thus enabling the charger 6100 to detect a coupling of the external device to the charger 6100).

The controller 6115 may be hardware, firmware, hardware executing software or any combination thereof. For example, the controller 6115 may be one or more Central Processing Units (CPUs), digital signal processors (DSPs), one or more circuits, application-specific-integrated-circuits (ASICs), field programmable gate arrays (FPGAs), and/or computers or the like configured as special purpose machines to perform the functions of the controller 6115.

For instance, if the controller 6115 is a processor executing software, the controller 6115 executes instructions stored in the computer readable storage medium 8325 to configure the processor as a special purpose machine Furthermore, as shown in the example embodiment of FIG. 17, the controller 6115 may be a combination of hardware and a processor executing software. As shown, hardware elements may include the power control circuit 8315, the LED control circuit 8320 and the computer-readable storage medium 8325. As shown, the microprocessor 8310 is configured to control the operation of the hardware elements described above by executing software stored on the storage medium 8325.

Figure 18:
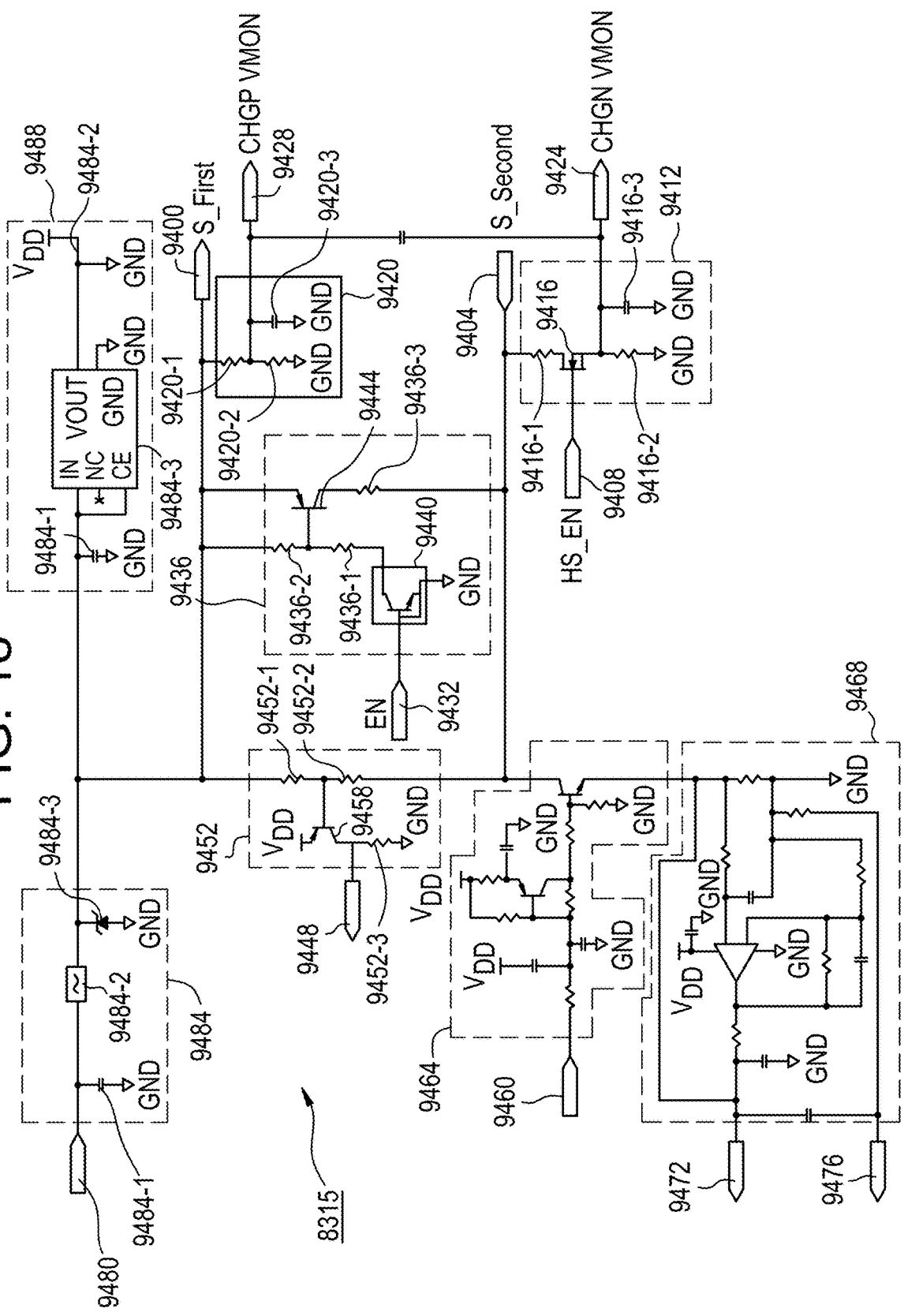
FIG. 18 illustrates the power control circuit of FIG. 17, according to one example embodiment.

FIG. 18 illustrates the power control circuit of FIG. 17, according to one example embodiment.

As shown, the power control circuit 8315 includes terminals 9400 and 9404. The terminal 9400 (which may be referred to as the CHGP terminal 9400) is connected to the one or more pins of the charger 6100. The magnet of the second section 100 is in contact with the terminal 9404 (which may be referred to as the CHGN terminal 9404) upon placement of the second section 100 into the charger 6100.

At the terminal 9408 (which may be referred to as the handshake terminal 9408), a periodic handshake enable signal HS_EN is supplied to the circuit 9412 of the power control circuit 8315 by the microprocessor 8310. The periodic enable signal HS_EN is provided to check for coupling of the second section 100 to the charger 6100 (e.g., handshaking of the charger 6100 and the second section 100). The handshake enable signal turns the switch 9416 on. The switch 9416 is shown as a MOSFET transistor but example embodiments are not limited thereto and the switch 9404 may be any other type of known or to be developed switch. The circuit 9412 may further include capacitive and resistive elements 9416-1 to 9416-3 as shown in FIG. 18 for purposes of providing loads and/or charge storage capacity at different terminals of the switch 9416 in order for current to flow through one terminal of the switch 9416 and voltage to be detected at another terminal of the switch 9416 when the switch 9416 is turned on.

The circuit 9420 may include one or more resistive and capacitive elements 9420-1 to 9420-3 as shown in FIG. 18 for purposes of providing loads and/or charge storage capacity in order to detect a voltage upon receiving the one or more pins at the terminal 9400.

When (1) a load of the one or more pins is provided at the terminal 9400, (2) the load of the magnet is provided at the terminal 9404, (3) the circuit 9412 detects the coupling of the charger 6100 and the second section 100, the power control circuit 8315 communicates the coupling to the microprocessor 8310 via the terminal 9424 (which may also be referred to as the CHGN voltage monitoring (CHGN VMON) terminal) and the terminal 9428 (which may also be referred to as the CHGP voltage monitoring (CHGP VMON) terminal).

Upon receiving the voltage monitoring signals from the terminals 9424 and 9428, the microprocessor 8310, through the terminal 9432, provides an enable signal EN to the circuit 9436. The circuit 9436 includes a booster 9440, a switch 9444 and a plurality of resistive elements 9436-1 to 9436-3 as shown in FIG. 18. The booster 9440 may serve to boost the enablement signal EN at the terminal 9430, prior to the enablement signal turning on the switch 9444. The boosted enablement signal may then be fed to the switch 9444 (e.g., to the gate of the switch 9444 when the switch 9444 is a BJT transistor) in order to turn on the switch 9444. Given that the boosted enablement signal at the terminal 9444 is a series of pulses that switch between a low voltage value and a high voltage value, the enablement signal EN periodically turns the switch 9444 on and off, thus generating a series of output voltage pulses. In one example embodiment, the generated series of output voltage pulses is the first signal S_First discussed above, provided to the second section via the terminal 9400.

As discussed above, the controller 500 of the second section 100, via the charge control circuit 520, generates the second signal S_Second in response to first signal S_First. The second signal S-Second is then provided by the controller 500 to the controller 6115 of the charger 6100. The second signal S_Second may then be received back at the terminal 9404 of the power control circuit 8315.

The received second signal may then be sent to the microprocessor 8310 of the controller 6115 via the power control circuit 8315. In one example embodiment, the second signal may be sent to the microprocessor 8310 via the terminal 9448 and the circuit 9452 of the power control circuit 8315.

The circuit 9452 may include, among other elements, resistive elements 9452-1 to 9452-3. The resistive elements 9452-1 to 9452-3 may act as current limiters and/or load in order for the second signal to cause the switch 9456 of the circuit 9452 to be turned on. Given that the second signal is a series of pulses that switch between a low voltage value and a high voltage value, the second signal periodically turns the switch 9456 on and off, thus generating a series of output voltage pulses at another terminal of the switch 9456 (e.g., the collector of the switch 9456 when the switch 9456 is a BJT transistor) that is representative of the second signal to be sent to the microprocessor 8310. As will be described below, the controller 6115, through the microprocessor 8310 authenticates the second section 100 prior to providing electric charge for charging the power supply 110 of the second section 100.

Upon authenticating the second section 100, the microprocessor 8310 provides a series of pulse width modulated (PWM) commands to the terminal 9460. The series of PWM commands are then provided to the circuit 9464, which through the resistive, capacitive and switching elements thereof, as shown in FIG. 18, regulate current for charging the power supply 110 of the second section 100.

In one example embodiment, the controller 6115, through the circuit 9468, may monitor the current supplied to the power supply 110 of the second section 100. In one example embodiment, the circuit 9468 may include resistive, capacitive and switching elements as shown in FIG. 18, for enabling the monitoring of the current provided to the power supply 110 of the second section 100. The supplied current as monitored through the circuit 9468 may then be sent to the microprocessor 8310 via the terminals 9472 and 9476.

In one example embodiment, the power control circuit 8315 may include a terminal 9480. The terminal 9480 may provide a constant DC power (e.g., 5 volts) for operation of the power control circuit 8315 and the microprocessor 8310. The constant DC power may be provided through a USB connection of the charger 6100 to a power supply (e.g., a wall-installed power outlet, a battery, a laptop, etc.). The DC power provided at the terminal 9480 may pass through the circuit 9484. The circuit 9484 may include a capacitive element 9484-1 for charge storing purposes, a fuse 9484-2 and a diode 9484-3. The fuse 9484-2 enables a supply of the DC power to the power control circuit 8315 and the microprocessor 8310. The diode 9484-3 may be an ESD regulator.

In one example embodiment, the DC power may be provided to the microprocessor 8310 via a low-dropout (LDO) circuit 9488. In one example embodiment, the LDO circuit 9488 may include capacitive elements 9484-1 and 9484-2 as well as the chip 9484-3, which operate as is known in the art. In one example embodiment, the LDO circuit 9422 may take as input the DC power at the terminal 9420 and provide a low output voltage for turning on the microprocessor 8310. For example the LDO circuit 9422 may take a 5V power supply at the terminal 9420 and provide 2.5V at the output of the LDO circuit 9422 to be supplied to the microprocessor 8310.

In the example embodiments described above with reference to FIGS. 16 and 18, desired (or, alternatively predetermined) values may be assigned to the resistive, capacitive and switching elements shown in FIGS. 16 and 18 and described above. Such values may be determined based on empirical studies.

Figure 19:
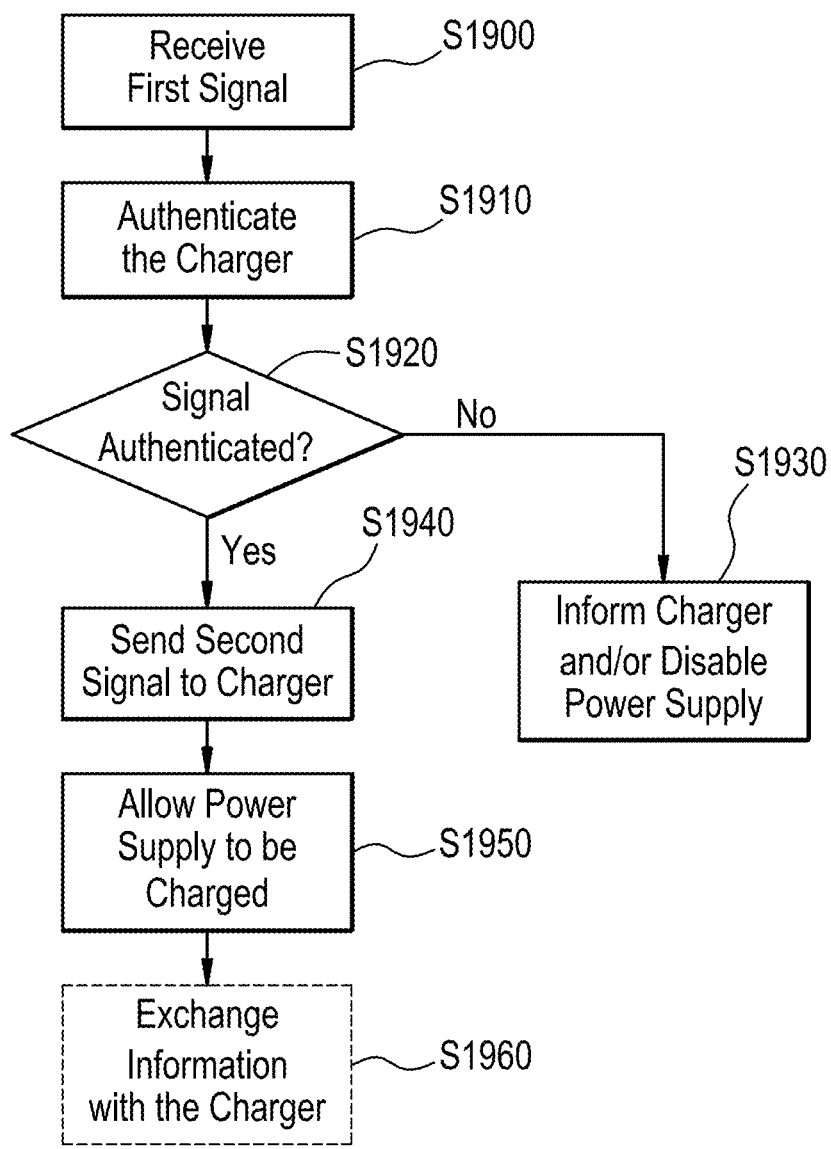
FIG. 19 is a flowchart describing the process of authenticating the charger and the electronic vaping device, according to one example embodiment.

FIG. 19 is a flowchart describing the process of authenticating the charger and the electronic vaping device, according to one example embodiment. FIG. 19 will be described below with reference to elements described in FIGS. 5A and 15-18. Furthermore, FIG. 10 describes the process of authentication by the controller 500 of the second section 100 of the electronic vaping device 10.

At S1900, the controller 500 receives the first signal from the charger 6100. The charger 6100 may generate the first signal as discussed above with reference to FIGS. 16 and 18 upon detection of coupling of the electronic vaping device 10 (or the second section 100 of the electronic vaping device 10) to the charger 6100. In one example embodiment, the first signal is a series of voltage pulses.

At S1910, the controller 500 performs the authentication of the charger 6100 based on the first signal received from the charger 6100. For example, the controller 500 may compare one or more characteristics of the first signal with a set of reference/expected values stored in the storage medium 505 of the controller 500. The one or more characteristics may include, but is not limited to, the frequency of the voltage pulses, the level of each voltage pulse, an average level of the received voltage pulses, a width of each voltage pulse, an average width of the voltage pulses, etc.

Accordingly, at S1910, the controller 500 compares the one or more characteristics of the first signal with a reference/expected frequency of voltage pulses, a reference/expected level of each voltage pulse, a reference/expected average frequency of voltage pulses, a reference/expected width of each voltage pulse, a reference/expected average width of the voltage pulses, etc.

At S1920, the controller 500 determines whether the first signal is authentic. For example, if the comparison at S1910 indicates that at least one of the one or more characteristics match the corresponding one of the reference/expected values stored in the storage medium 505, the controller 500 determines that the first signal is authentic. In one example embodiment, the controller 500 may determine the first signal to be authentic if all of the one or more characteristics of the first signal match their corresponding reference/expected values stored in the storage medium 505. In one example embodiment, the controller 500 may determine the first signal to be authentic if a majority or a certain number of the one or more characteristics of the first signal match their corresponding reference/expected values stored in the storage medium 505.

If at S1920 the controller 500 determines that the first signal is not authentic, then at S1930, the controller 500 may send a signal to that effect to the charger 6100 informing the charger 6100 that the charger 6100 is not authorized to charge the power supply 110 of the second section 100. Furthermore, at S1930, the controller 500 may also disable the terminals of the power supply 110 and prevent the power supply 110 from being charged by the charger 6100.

However, if at S1920 the controller 500 determines that the first signal is authentic, then at S1940 the controller 500 may transmit the second signal (as discussed above with reference to FIGS. 15-18) to the charger 6100. In one example embodiment, the second signal may also be a series of voltage pulses similar to the first signal. The authentication of the second signal by the charger 6100 will be described below with reference to FIG. 20.

Upon authentication of the first signal, the controller 500 applies a voltage received from the charger 6100 across terminals of the power supply 110 such that the charger 6100 charges the power supply 110.

Upon initiation, during or after completion of the charging of the power supply 10 by the charger 6100, the method described above with reference to FIG. 19 may further include an optional step S1960. At S1960 the controller 100 may exchange information with the charger, through an exchange of series of voltage pulses in the same manner as the exchange of first and second signals described above. For example, the controller 500 may send information to the charger 6100, which may include, but is not limited to, any one of a version of the power supply 110 and/or the electronic vaping device 10, at least one error code detected by the power supply 110, a current/present estimated power supply charge level, information associated with the power supply 110 indicating at least one of maximum voltage level and desired charge rate of the power supply 110.

At S1960, the controller 500 may also receive a plurality of information from the charger 6100, which may include, but is not limited to, any one of a version of the charger 6100, a plurality of sets points associated with the electronic vaping device 10 including heating voltage settings, light emitting diode settings and operational limits of the electronic vaping device 10, reset codes for resetting the electronic vaping device 10 when the electronic vaping device 10 and the charger 6100 are coupled, and updates associated with at least one software executed by the controller 500 and/or the controller 6115 of the charger 6100.

Figure 20:
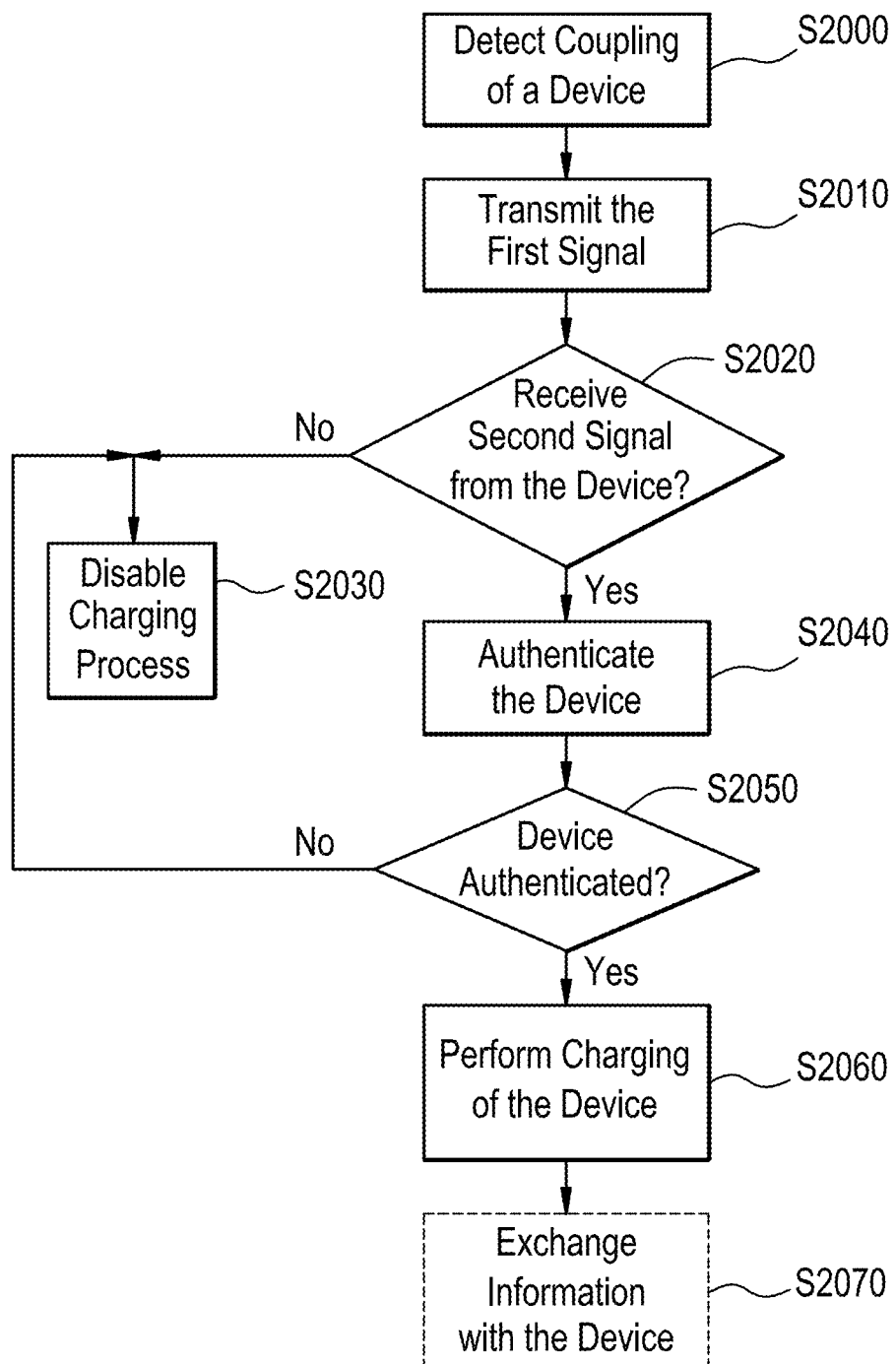
FIG. 20 is a flowchart describing the process of authenticating the charger and the electronic vaping device, according to one example embodiment.

FIG. 20 is a flowchart describing the process of authenticating the charger and the electronic vaping device, according to one example embodiment. FIG. 20 will be described below with reference to elements described in FIGS. 5A and 15-18. Furthermore, FIG. 20 describes the process of authentication by the controller 6115 of the charger 6100.

At S2000, the controller 6115 detects the coupling of a device to the charger 6100. The device may be an external device such as the electronic vaping device 10 or the second section 100 of the electronic vaping device 10. The controller 6115 may detect the coupling of the device as described above with reference to FIGS. 17-18.

At S2010, the controller 6115 may generate and transmit the first signal to the device. The generation and transmission of the first signal may be the same as described above with reference to FIGS. 17-18.

At S2020, the controller 6115 determines whether the second signal, which is a signal as described above, is received at the controller 6115. The reception of the second signal and detection thereof may be performed as described above with reference to FIGS. 17-18. In one example embodiment, the controller 6115 may set a time window (e.g., from a few milliseconds to a few seconds) during which the controller 6115 checks for reception of the second signal. The time window may be set based on empirical studies and may be re-configurable.

If at S2020, the controller 6115 determines that the second signal is not received within the time window, the controller 6115 may terminate the authentication process and/or the process of charging the power supply 110 of the device at S2030.

However, if at S2020 the controller 6115 determines that the second signal is received from the device, then at S2040 the controller 6115 authenticates the device. In one example embodiment, the controller 6115 authenticates the device by comparing the first signal transmitted by the controller 6115 to the device with the second signal received by the controller 6115 from the device. For example, the controller 6115 may compare one or more characteristics of the first and second signal, where the one or more characteristics may be, but is not limited to, any one of the frequencies of the voltage pulses of the first and second signals, the level of each voltage pulse of the first and second signals, an average level of the received voltage pulses of the first and second signals, a width of each voltage pulse of the first and second signals, an average width of the voltage pulses of the first and second signals, etc.

At S2050, if the controller 6115 determines that the device is not authenticated, the process proceeds to S2030, as described above. However, if at S2050 the controller 6115 determines that the device is authenticated, then at S2060, the controller 6115 performs the charging of the device (e.g., the charging of the power supply 110 of the device shown in FIG. 5A) by providing electric charge to the device.

Upon initiation, during or after completion of the charging of the power supply 10 by the charger 6100, the method described above with reference to FIG. 20 may further include an optional step S2070. At S2070 the controller 6115 may exchange information with the device (e.g., the electronic vaping device 10 or the second section 100 thereof), through an exchange of series of voltage pulses in the same manner as the exchange of first and second signals described above.

For example, the controller 6115 may receive information from the device (e.g., the electronic vaping device 10 or the second section 100 thereof) which may include, but is not limited to, any one of a version of the power supply 110 and the electronic vaping device 10, at least one error code detected by the power supply 110, a current/present estimated power supply charge level, information associated with the power supply 110 indicating at least one of maximum voltage level and desired charge rate of the power supply 110.

At S2070, the controller 6115 may also transmit a plurality of information to the device, which may include, but is not limited to, any one of a version of the charger 6100, a plurality of sets points associated with the electronic vaping device 10 including heating voltage settings, light emitting diode settings and operational limits of the electronic vaping device 10, reset codes for resetting the electronic vaping device 10 when the electronic vaping device 10 and the charger 6100 are coupled, and updates associated with at least one software executed by the controller 500 of the electronic vaping device 10 and/or the controller 6115 of the charger 6100.

In one example embodiment, the authentication process performed by the charger 6100 and the electronic vaping device 10 may be performed automatically and without an intervention by the adult vaper of the electronic vaping device (e.g., without an input being required from the adult vaper).

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A controller of an electronic vaping (e-vaping) device, comprising:
    control circuitry configured to cause the e-vaping device to,
        generate a control signal for controlling detection of whether a cartridge section is being connected to and being disconnected from a power supply section,
        receive a detection signal based on the control signal,
        detect attachment events based on the detection signal, the attachment events indicating whether the cartridge section is being attached to or being detached from the power supply section,
        store the detected attachment events in a table, and
        enter a sleep mode if a first time period elapses after one of the detected attachment events and stay in a same operation mode if the first time period has not elapsed, wherein the sleep mode is at least one of
        a mode in which the control circuitry disables a pressure sensor of the e-vaping device,
        a mode in which the control circuitry reduces a frequency of read requests for the pressure sensor while continuing to check for attachment events, or
        a mode in which the control circuitry terminates a read request for the pressure sensor, wherein
        the pressure sensor is a microelectromechanical (MEMS) sensor, and
    wherein the control circuitry includes a cartridge detection circuit including a first resistor having a first end connected to an input terminal and a second end connected to a metal-oxide-semiconductor field effect transistor (MOSFET) switch which has a gate connected to a control terminal, a second resistor having a first end connected to the MOSFET switch and a second end connected to a ground terminal and to a base of a bipolar junction transistor (BJT) switch which has an emitter connected to a detection terminal.

2. The controller of claim 1, wherein the sleep mode is the mode in which the control circuitry disables the pressure sensor of the e-vaping device.

3. The controller of claim 1, wherein the control circuitry is configured to cause the e-vaping device to count a number of the detected attachment events corresponding to the cartridge section being attached to the power supply and being detached from the power supply.

4. The controller of claim 3, wherein the control circuitry is configured to cause the e-vaping device to select an operation mode from among a plurality of operation modes based on the counted number of the detected attachment events, and operate the e-vaping device according to the selected operation mode.

5. The controller of claim 4, wherein the plurality of operation modes include a plurality of modes based on profiles associated with different operating preferences.

6. The controller of claim 3, wherein the control circuitry is configured to cause the device to,
    store the detected attachment events during a second time period, and
    count the number of the detected attachment events occurring during the second time period.

7. The controller of claim 1, wherein the control circuitry is configured to cause the e-vaping device to store the detected attachment events in a storage medium for subsequent data collection.

8. The controller of claim 1, wherein the sleep mode is the mode in which the control circuitry reduces the frequency of read requests for the pressure sensor while continuing to check for attachment events.

9. The controller of claim 1, wherein the sleep mode is the mode in which the control circuitry terminates a read request for the pressure sensor.

10. The controller of claim 1, wherein the cartridge detection circuit is configured to cause the controller to,
    receive an input voltage from an anode of a connecting portion of the power supply section, the connecting portion detachably connecting the power supply section to the cartridge section,
    divide the input voltage to generate an output voltage, and
    generate the detection signal based on the output voltage.

11. The controller of claim 10, wherein the cartridge detection circuit includes, the input terminal configured to receive the input voltage from the connecting portion of the power supply section;

a voltage divider configured to divide the input voltage to generate the output voltage; and the detection terminal configured to output the detection signal based on the output voltage.

12. The controller of claim 1, wherein the pressure sensor does not compare a differential between an ambient pressure and a non-ambient pressure.

13. The controller of claim 1, wherein the pressure sensor is configured to detect a threshold pressure change based on a current ambient pressure and a baseline pressure.

14. The controller of claim 13, wherein the baseline pressure is a rolling average of previous measurements of ambient pressure.

15. The controller of claim 14, wherein the baseline pressure is determined based on a guard band.

16. The controller of claim 1, wherein the MEMS sensor is configured to be upstream from a power supply of e-vaping device.

17. The controller of claim 1, wherein the MEMS sensor is configured to be connected to a cathode of a power supply of the e-vaping device by a wire that extends a length of the power supply.

18. The controller of claim 1, wherein the controller is configured to control at least one light emitting diode, the at least one light emitting diode on a same end of the e-vaping device as the MEMS sensor.

19. The controller of claim 1, wherein the MEMS sensor and the cartridge detection circuit are on a same printed circuit board.

* * * * *